United States Patent
Fujimori et al.

(10) Patent No.: US 8,110,324 B2
(45) Date of Patent: Feb. 7, 2012

(54) PHOTOSENSITIVE RESIN COMPOSITION, LIGHT-SHIELDING COLOR FILTER AND PRODUCTION PROCESS THEREFOR, AND IMAGE SENSOR

(75) Inventors: Toru Fujimori, Shizuoka (JP); Yoichi Maruyama, Shizuoka (JP); Hiroyuki Einaga, Shizuoka (JP); Kazuto Shimada, Shizuoka (JP); Tomotaka Tsuchimura, Shizuoka (JP); Yushi Kaneko, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 340 days.

(21) Appl. No.: 12/407,935

(22) Filed: Mar. 20, 2009

(65) Prior Publication Data
US 2009/0246650 A1 Oct. 1, 2009

(30) Foreign Application Priority Data
Mar. 28, 2008 (JP) .................................. 2008-088683

(51) Int. Cl.
*G02B 5/20* (2006.01)
(52) U.S. Cl. ... 430/7; 430/270.1; 430/287.1; 430/288.1; 257/432
(58) Field of Classification Search ........................ None
See application file for complete search history.

(56) References Cited

FOREIGN PATENT DOCUMENTS

| | | |
|---|---|---|
| EP | 1826200 A2 | 8/2007 |
| JP | 09-054431 A | 2/1997 |
| JP | 10-046042 A | 2/1998 |
| JP | 10-246955 A | 9/1998 |
| JP | 2005-338328 A * | 12/2005 |
| JP | 2006-036750 A | 2/2006 |
| JP | 2007-115921 A | 5/2007 |
| WO | 02/100903 A1 | 12/2002 |
| WO | 2006/046736 A1 | 5/2006 |
| WO | 2008/035671 A1 | 3/2008 |

OTHER PUBLICATIONS

Computer-generated translation of JP 2005-338328 (Dec. 2005).*
Computer-generated translation of JP 2007-115921 (May 2007).*
C. Gabriele et al., "Photosensitive compositions comprising a ketoxime-ester as photoinitiator and the use thereof for manufacturing color filters". IP.COM Journal, vol. 3, May 8, 2003, pp. 1-17. XP013006458.

* cited by examiner

*Primary Examiner* — John A. McPherson
(74) *Attorney, Agent, or Firm* — Sughrue Mion, PLLC

(57) ABSTRACT

A photosensitive resin composition is provided that includes at least (A) titanium black, (B) two or more types of polymerizable compounds, (C) a resin, (D) a photopolymerization initiator, and (E) an organic solvent. There are also provided a light-shielding color filter formed by using the photosensitive resin composition, and a process for producing a light-shielding color filter, the process including a step of coating a substrate with the photosensitive resin composition, a step of imagewise exposing, and a step of developing to form a pattern. Furthermore, there is provided an image sensor that includes the light-shielding color filter.

12 Claims, 3 Drawing Sheets

PHOTOSENSITIVE RESIN COMPOSITION, LIGHT-SHIELDING COLOR FILTER AND PRODUCTION PROCESS THEREFOR, AND IMAGE SENSOR

BACKGROUND OF THE INVENTION

1. Field of the Invention

The present invention relates to a photosensitive resin composition, a light-shielding color filter and a production process therefore, and an image sensor.

2. Description of the Related Art

A color filter used in a liquid crystal display device comprises a light-shielding film called a black matrix for the purpose of improving contrast by shielding light between color pixels, etc. Furthermore, in an image sensor which is also called a solid-state image sensor, a light-shielding film is provided for the purpose of preventing the occurrence of dark current (noise) due to stray light and improving image quality.

As a composition for forming a black matrix for a liquid crystal display device or a light-shielding film for an image sensor, a photosensitive resin composition comprising a black color material such as carbon black or titanium black is known (ref. e.g. JP-A-10-246955, JP-A-9-54431, JP-A-10-46042, JP-A-2006-36750, and JP-A-2007-115921) (JP-A denotes a Japanese unexamined patent application publication).

BRIEF SUMMARY OF THE INVENTION

As a black matrix for a liquid crystal display device, light-shielding properties in mainly the visible region are required, whereas as a light-shielding film for an image sensor (hereinafter, synonymous with 'light-shielding color filter'), in addition to light-shielding properties in the visible region, it is necessary to have light-shielding properties in the IR region.

Furthermore, a black matrix for a liquid crystal display device is required to be microfabricated, whereas a light-shielding film for an image sensor (solid-state image sensor) is required to have a capability of shielding light evenly over the whole area of a wafer. As a light-shielding film for an image sensor, it is important to have a light-shielding film disposed on an image pickup section periphery, which is a region around the image pickup section (effective pixel region) and/or a light-shielding film disposed between protruding electrodes on a reverse face opposite to a surface on which the image pickup section is formed.

However, when as a light-shielding film for an image sensor a light-shielding film is formed on a pattern having a step within a plane using the above-mentioned known photosensitive resin composition, the film thickness of the light-shielding film tends to become thinner in a wafer peripheral section than in a wafer central section, and the light-shielding performance of the element in the wafer peripheral section can sometimes become low.

Furthermore, there is the problem that adhesion between a substrate and a light-shielding film is insufficient, and as a result of chipping or peeling of the light-shielding film, the light-shielding performance becomes low. The present invention has been accomplished in the light of the above-mentioned problems.

It is an object of the present invention to provide a photosensitive resin composition that gives a light-shielding color filter having excellent adhesion to a substrate and having excellent coating thickness uniformity on a wafer. Moreover, it is another object of the present invention to provide a light-shielding color filter formed by the photosensitive resin composition and a production process therefore, and an image sensor.

The objects of the present invention have been attained by means described in (1), and (10) to (12) below. They are described below together with (2) to (9), which are preferred embodiments.

(1) A photosensitive resin composition comprising at least (A) titanium black, (B) two or more types of polymerizable compounds, (C) a resin, (D) a photopolymerization initiator, and (E) an organic solvent, (2) the photosensitive resin composition according to (1) above, wherein the two or more types of polymerizable compounds (B) comprise two or more types of polymerizable compounds having different numbers of ethylenically unsaturated groups per molecule, (3) the photosensitive resin composition according to (1) or (2) above, wherein the two or more types of polymerizable compounds (B) comprise full (meth)acrylic acid esters of two or more types of aliphatic polyols having different numbers of hydroxy groups, (4) the photosensitive resin composition according to any one of (1) to (3) above, wherein the two or more types of polymerizable compounds (B) comprise (meth)acrylic acid esters of pentaerythritol and/or dipentaerythritol, (5) the photosensitive resin composition according to any one of (1) to (4) above, wherein the photopolymerization initiator (D) comprises an oxime-based initiator, (6) the photosensitive resin composition according to (5) above, wherein the oxime-based initiator is represented by Formula (1) below

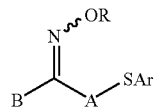

(in Formula (1), R and B independently denote a monovalent substituent, A denotes a divalent organic group, and Ar denotes an aryl group), (7) the photosensitive resin composition according to (5) or (6) above, wherein the oxime-based initiator is represented by Formula (2) below

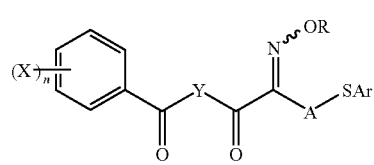

(in Formula (2), R and X independently denote a monovalent substituent, A and Y independently denote a divalent organic group, Ar denotes an aryl group, and n is an integer of 0 to 5), (8) the photosensitive resin composition according to any one of (5) to (7) above, wherein the oxime-based initiator is represented by Formula (3) below,

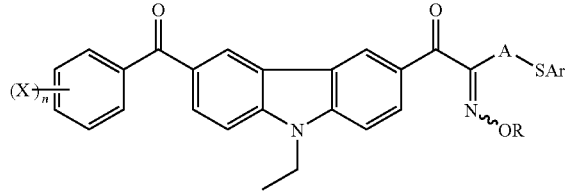

(3)

(in Formula (3), R and X independently denote a monovalent substituent, A denotes a divalent organic group, Ar denotes an aryl group, and n is an integer of 0 to 5), (9) the photosensitive resin composition according to any one of (1) to (8) above, wherein it is intended for use in an image sensor,

(10) a light-shielding color filter comprising a pattern formed by using the photosensitive resin composition according to any one of (1) to (9) above,

(11) a process for producing a light-shielding color filter, the process comprising a step of coating a substrate with the photosensitive resin composition according to any one of (1) to (9) above, a step of imagewise exposing, and a step of developing to form a pattern, and

(12) an image sensor comprising the light-shielding color filter according (10).

EXPLANATION OF REFERENCE NUMERALS AND SYMBOLS

Figure 1:
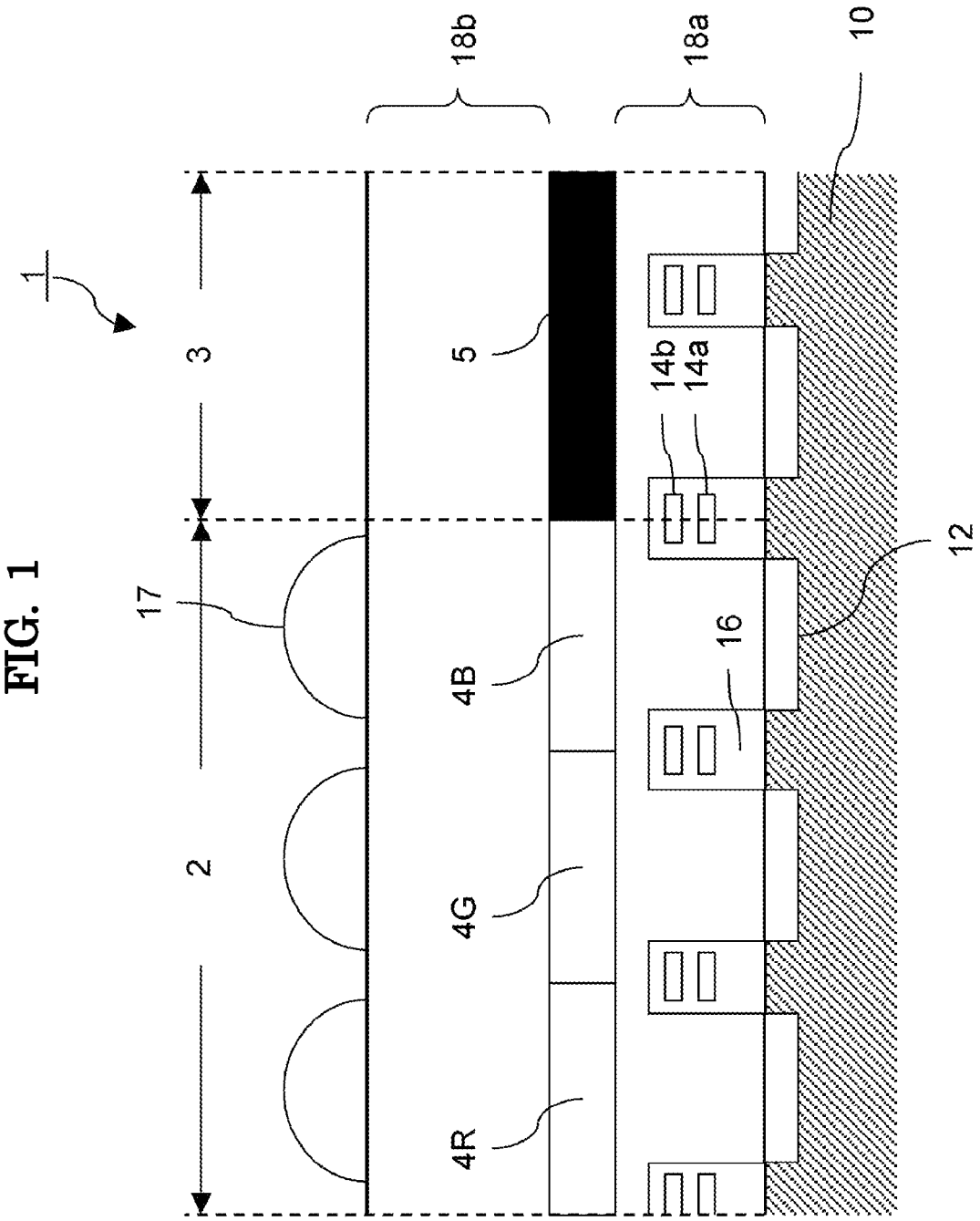
FIG. 1 A sectional view showing one example of an image pickup section and a light-shielding section disposed on the periphery in the image sensor of the present invention.

| | |
|---|---|
| 1: | Image sensor |
| 2: | Image pickup section |
| 3: | Light shielding section |
| 4R, 4G, 4B: | Color filter |
| 5: | Light-shielding color filter |
| 10: | Silicon substrate |
| 12: | Photoelectric transducer (light-receiving sensor section) |
| 14a, 14b: | Transfer electrode |
| 16: | Insulating film |
| 17: | Microlens |
| 18a, 18b: | Planarization layer |
| 20: | Solid-state image pickup device |
| 21: | Wiring board |
| 22: | Solid-state image pickup chip |
| 23: | Light-shielding color filter |
| 24: | Image sensor |
| 25: | Underfill resin |
| 26: | Protruding electrode |
| 27: | Through electrode |
| 30: | Bonding pad |
| 50: | Solder ball |

DETAILED DESCRIPTION OF THE INVENTION (1) Photosensitive Resin Composition

The photosensitive resin composition of the present invention comprises at least (A) titanium black, (B) two or more types of polymerizable compounds, (C) a resin, (D) a photopolymerization initiator, and (E) an organic solvent. The photosensitive resin composition of the present invention may comprise another component as an additive in addition to (A) to (E) above.

Furthermore, the photosensitive resin composition of the present invention may be suitably used as a photosensitive resin composition for an image sensor which is also called a solid-state image sensor or a solid-state image pickup element, and may be suitably used in order to form a light-shielding color filter (light-shielding film) in an image sensor.

Each component of the photosensitive resin composition of the present invention is explained below.

(A) Titanium black

The photosensitive resin composition of the present invention comprises titanium black as a black color material.

Since titanium black has high light-shielding capacity in the IR region compared with conventional pigments and dyes that are dispersed and dissolved in a photosensitive resin composition, in particular a photosensitive resin composition for a color filter, light shielding in the IR region, which cannot be carried out by superimposition of color filters, can be carried out reliably. In particular, a light-shielding film formed by curing the photosensitive resin composition of the present invention has high light-shielding properties in the IR region, and noise due to dark current in an image sensor equipped with the light-shielding film can be suppressed.

Furthermore, compared with carbon black, which is generally used as a black color material, titanium black has little absorption of i ray irradiation used for formation of a pattern, and curing can be carried out with a smaller amount of exposure, thus contributing to an improvement in productivity.

Titanium black comprises titanium atom-containing black particles. It is preferably low valence titanium oxide, titanium oxynitride, etc. The surface of titanium black particles can be chemically modified as necessary for the purpose of improving dispersibility, suppressing aggregability, etc. Specifically, the surface of titanium black can be covered with silicon oxide, titanium oxide, germanium oxide, aluminum oxide, magnesium oxide, or zirconium oxide, and it is also possible to carry out a surface treatment with a water-repellent material such as that shown in JP-A-2007-302836.

Furthermore, for the purpose of adjusting dispersibility, coloration properties, etc., the titanium black may comprise one type of black pigment such as a composite oxide of Cu, Fe, Mn, V, Ni, etc., cobalt oxide, iron oxide, carbon black, or aniline black, or two or more types thereof in combination.

Moreover, for the purpose of controlling light-shielding properties at a desired wavelength, an existing colorant such as a red, blue, green, yellow, cyan, magenta, violet, orange, etc. pigment or dye may be added.

Examples of commercially available titanium black include titanium black 10S, 12S, 13R, 13M, 13M-C, 13R, and 13R-N manufactured by Jemco Inc. (sold by Mitsubishi Materials Corporation), and Tilack D manufactured by Ako Kasei Co., Ltd.

As a process for producing the titanium black, there are a process in which a mixture of titanium dioxide and metallic titanium is heated in a reducing atmosphere, thus carrying out reduction (JP-A49-5432), a process in which ultrafine titanium dioxide obtained by high temperature hydrolysis of titanium tetrachloride is reduced in a reducing atmosphere containing hydrogen (JP-A-57-205322), a process in which titanium dioxide or titanium hydroxide is reduced at high temperature in the presence of ammonia (JP-A-60-65069, JP-A-61-201610), a process in which a vanadium compound is deposited on titanium dioxide or titanium hydroxide, and a high temperature reduction is carried out in the presence of ammonia (JP-A-61-201610), etc. and the process is not limited thereto.

The particle size of the titanium black particles is not particularly limited, but from the viewpoint of dispersibility and coloration properties and from the viewpoint of influence on yield for an image sensor, the average particle size (average primary particle size) is preferably 10 to 150 nm, more preferably 10 to 100 nm, and particularly preferably 80 to 100 nm.

The average particle size of titanium black may be measured by coating an appropriate substrate therewith and examining with a scanning electron microscope.

The specific surface area of the titanium black is not particularly limited, but in order to obtain predetermined performance for water repellency after titanium black is surface-treated with a water repellant, a value measured by a BET method is preferably about 5 to 150 m$^2$/g, and more preferably about 20 to 100 m$^2$/g.

In the present invention, titanium black and another black color material may be used in combination, and with regard to the black color material other than titanium black, one type thereof may be used on its own or two or more types thereof may be used in combination.

As a black color material that can be used in combination, various known black pigments or black dyes may be used, and from the viewpoint of realizing high optical density with a small amount, carbon black, iron oxide, manganese oxide, graphite, etc. are particularly preferable, and among them carbon black is preferable.

The carbon black is in the form of black fine particles comprising carbon fine particles, and preferred particles comprise carbon fine particles having a diameter of about 3 to 1,000 nm. Furthermore, the surface of the fine particles may have various types of functional groups containing a carbon atom, a hydrogen atom, an oxygen atom, a sulfur atom, a nitrogen atom, a halogen, an inorganic atom, etc.

Moreover, the properties of carbon black may be changed according to an intended application by variously changing particle size (dimensions of particle), structure (connection of particles), and surface properties (functional group). It is also possible to change the degree of blackness or affinity for a resin, or impart electroconductivity.

Specific examples of the carbon black include Carbon Black #2400, #2350, #2300, #2200, #1000, #980, #970, #960, #950, #900, #850, MCF88, #650, MA600, MA7, MA8, MA11, MA100, MA220, IL30B, IL31B, IL7B, IL11B, IL52B, #4000, #4010, #55, #52, #50, #47, #45, #44, #40, #33, #32, #30, #20, #10, #5, CF9, #3050, #3150, #3250, #3750, #3950, DIABLACK A, DIABLACK N220M, DIABLACK N234, DIABLACK I, DIABLACK LI, DIABLACK II, DIABLACK N339, DIABLACK SH, DIABLACK SHA, DIABLACK LH, DIABLACK H, DIABLACK HA, DIABLACK SF, DIABLACK N550M, DIABLACK E, DIABLACK G, DIABLACK R, DIABLACK N760M, and DIABLACK LP manufactured by Mitsubishi Chemical Corporation; Carbon Black Thermax N990, N991, N907, N908, N990, N991, and N908 manufactured by Cancarb; Carbon black Asahi #80, Asahi #70, Asahi #70L, Asahi F-200, Asahi #66, Asahi #66HN, Asahi #60H, Asahi #60U, Asahi #60, Asahi #55, Asahi #50H, Asahi #51, Asahi #50U, Asahi #50, Asahi #35, Asahi #15, and Asahi Thermal manufactured by Asahi Carbon Co., Ltd.; and Carbon Black COLOR BLACK FW200, COLOR BLACK FW2, COLOR BLACK FW2V, COLOR BLACK FW1, COLOR BLACK FW18, COLOR BLACK S170, COLOR BLACK S160, SPECIAL BLACK 6, SPECIAL BLACK 5, SPECIAL BLACK 4, SPECIAL BLACK 4A, PRINTEX U, PRINTEX V, PRINTEX 140U, and PRINTEX 140V manufactured by Degussa.

The carbon black might preferably have insulating properties.

The carbon black having insulating properties is carbon black that exhibits insulating properties when volume resistivity as a powder is measured by the method below. These insulating properties are based on an organic compound present on the surface of carbon black particles, such as an organic material adsorbing on, covering, or chemically bonding (grafting) to the surface of carbon black particles.

That is, a coating liquid is prepared by dispersing carbon black in propylene glycol monomethyl ether acetate at a ratio by weight of 20:80 relative to a copolymer (weight-average molecular weight 30,000) of benzyl methacrylate and methacrylic acid with a molar ratio of 70:30, and applied to a chromium substrate with a thickness of 1.1 mm and dimensions of 10 cm×10 cm so as to give a coating with a dry film thickness of 3 μm, the coating thus obtained is heated on a hot plate at 220° C. for about 5 minutes, and a volume resistivity value is measured by applying a voltage using a Hiresta-UP (MCP-HT450) manufactured by Mitsubishi Chemical Corporation, which is a high resistivity meter in accordance with JIS K6911, under an environment of 23° C. and a relative humidity of 65%. It is preferable to use carbon black having a volume resistivity value of at least $10^5$ Ω·cm, more preferably at least $10^6$ Ω·cm, and particularly preferably at least $10^7$ Ω·cm.

As the above-mentioned carbon black, resin-coated carbon black disclosed in, for example, JP-A-11-60988, JP-A-11-60989, JP-A-10-330643, JP-A-11-80583, JP-A-11-80584, JP-A-9-124969, and JP-A-9-95625 may be used.

With regard to the average particle size (average primary particle size) of the black color material that is used in combination with titanium black, from the viewpoint of the occurrence of foreign matter and from the viewpoint of the influence on yield in the production of an image sensor, the average primary particle size is preferably small. The average primary particle size is preferably 10 to 100 nm, more preferably no greater than 50 nm, and yet more preferably no greater than 30 nm.

The average particle size may be measured by coating an appropriate substrate with the black color material and examining with a scanning electron microscope.

The content of titanium black in the photosensitive resin composition is not particularly limited, but the average transmittance of a resulting light-shielding color filter in the visible region to IR region (400 to 1,600 nm) is preferably no greater than 1%. It is preferable that an optical density of at least 2.0 is obtained at substantially the same film thickness as that of an RGB, etc. color separation filter. The amount of titanium black combined is preferably 10 to 60 wt % of the solids content of the photosensitive resin composition, and more preferably 20 to 40 wt %.

When titanium black is used in combination with another black color material, the ratio by weight of titanium black: other black color material is preferably 95:5 to 60:40, more preferably 95:5 to 70:30, and yet more preferably 90:10 to 80:20. When a plurality of said other black color materials are used in combination, the total weight thereof is preferably in the above-mentioned range.

It is preferable to set the ratio by weight of titanium black and the other black color material in the above-mentioned range since the dispersibility in the photosensitive resin composition becomes good, and an even and stable coating can be formed.

Furthermore, dispersion of the above-mentioned titanium black or carbon black may employ a dispersant having an acid value/amine value, and specific examples thereof include Solsperse 24000 and Solsperse 33500 manufactured by Avecia and DISPER BYK-161 manufactured by BYK-Chemie Japan. 'Having an acid value/amine value' referred to here means comprising a group having an acid value, comprising a group having an amine value, or having both thereof.

Furthermore, as another dispersant, a homopolymer or a copolymer obtained by polymerization of a monomer such as (meth)acrylic acid, a (meth)acrylic acid ester, (meth)acrylamide or a derivative thereof, or styrene or a derivative thereof may be used.

Examples of the monomer include styrene-based monomers such as styrene, o-methylstyrene, m-methylstyrene, p-methylstyrene, α-methylstyrene, p-methoxystyrene, p-tert-butylstyrene, p-phenylstyrene, o-chlorostyrene, m-chlorostyrene, and p-chlorostyrene; (meth)acrylic acid-based monomers such as acrylic acid, methyl acrylate, ethyl acrylate, propyl acrylate, n-butyl acrylate, isobutyl acrylate, dodecyl acrylate, stearyl acrylate, 2-ethylhexyl acrylate, hydroxyethyl acrylate, hydroxypropyl acrylate, methacrylic acid, methyl methacrylate, ethyl methacrylate, propyl methacrylate, n-butyl methacrylate, isobutyl methacrylate, n-octyl methacrylate, dodecyl methacrylate, benzyl methacrylate, 2-ethylhexyl methacrylate, stearyl methacrylate, hydroxyethyl methacrylate, and hydroxypropyl methacrylate, ethylene, propylene, butylene, vinyl chloride, vinyl acetate, acrylonitrile, acrylamide, methacrylamide, and N-vinylpyrrolidone.

Examples of homopolymers or copolymers include homopolymers or copolymers of various types of monomers described above. Among them, (meth)acrylic acid ester-based polymers are preferable.

Furthermore, as another material that can be used for dispersion, a resin such as a polyurethane or a polyimide, or a siloxane-based polymer described in JP-A-2002-241616 or JP-A-2002-234995 may be used.

The molecular weight of a resin used as a dispersant is not limited as long as dispersibility can be guaranteed, but from the viewpoint of dispersibility, the weight-average molecular weight is preferably 500 to 200,000, more preferably 800 to 50,000, and yet more preferably 1,000 to 30,000.

As a dispersion medium for dispersing a black color material such as the titanium black or carbon black, as long as it can function as a dispersion solvent, various types of water-soluble or water-insoluble media may be used and, for example, alcohols such as methyl alcohol, ethyl alcohol, isopropyl alcohol, butyl alcohol, and allyl alcohol; glycols and derivatives thereof such as ethylene glycol, propylene glycol, propylene glycol monomethyl ether, diethylene glycol, polyethylene glycol, polypropylene glycol, diethylene glycol monoethyl ether, polyethylene glycol monoethyl ether, polyethylene glycol monoallyl ether, and polypropylene glycol monoallyl ether; glycerols and derivatives thereof such as glycerol, glycerol monoethyl ether, and glycerol monoallyl ether; ethers such as tetrahydrofuran and dioxane; ketones such as methyl ethyl ketone and methyl isobutyl ketone; hydrocarbons such as liquid paraffin, decane, decene, methylnaphthalene, decalin, kerosene, diphenylmethane, toluene, dimethylbenzene, ethylbenzene, diethylbenzene, propylbenzene, cyclohexane, and partially hydrogenated triphenyl, silicone oils such as polydimethylsiloxane, partially octyl-substituted polydimethylsiloxane, partially phenyl-substituted polydimethylsiloxane, and fluorosilicone oil, halohydrocarbons such as chlorobenzene, dichlorobenzene, bromobenzene, chlorodiphenyl, and chlorodiphenylmethane, fluorides such as DAIFLOIL (Daikin Industries Ltd.) and DEMNUM (Daikin Industries Ltd.), ester compounds such as ethyl benzoate, octyl benzoate, dioctyl phthalate, trioctyl trimellitate, dibutyl sebacate, ethyl (meth)acrylate, butyl (meth)acrylate, dodecyl (meth)acrylate, ethyl acetate, butyl acetate, and propylene glycol monomethyl ether acetate, and amide-based solvents such as N,N-dimethylacrylamide, N,N-dimethylacetamide, and N-methylpyrrolidone may be selected as appropriate and used singly or in a combination of a plurality thereof.

When preparing a dispersion of a black color material such as titanium black in the present invention, relative to 100 parts by weight of black color material, 5 to 200 parts by weight of polymer component is preferably added, and more preferably 10 to 100 parts by weight.

When the polymer component is at least 5 parts by weight, the surface properties of the black color material can be maintained well, and when the polymer component is no greater than 200 parts by weight, properties intrinsically required for the black color material such as light-shielding properties and coloration properties can be improved.

The photosensitive resin composition of the present invention may comprise, in addition to the above-mentioned black color material, a known colorant such as a red, blue, green, yellow, cyan, magenta, violet, orange, etc. pigment or dye for the purpose of controlling light-shielding properties at a desired wavelength.

(B) Polymerizable Compound

The photosensitive resin composition of the present invention comprises a polymerizable compound. This polymerizable compound is preferably a compound that is addition-polymerized by the action of a photopolymerization initiator. It is preferable to use as the polymerizable compound an ethylenically unsaturated compound having at least one ethylenically unsaturated bond per molecule.

As the polymerizable compound, a polyfunctional ethylenically unsaturated compound having two or more terminal ethylenically unsaturated bonds is more preferable. Such a group of compounds is widely known in the present industrial field, and they may be used in the present invention without any particular restriction. They have a chemical configuration of, for example, monomer, dimer, trimer, oligomer, or a mixture thereof. The polymerizable compound preferably has a molecular weight of 70 to 2,000, and more preferably 100 to 1,000.

Examples of the monomer include unsaturated carboxylic acids (e.g. acrylic acid, methacrylic acid, itaconic acid, crotonic acid, isocrotonic acid, maleic acid, etc.), esters thereof, and amides thereof, and an ester of an unsaturated carboxylic acid and an aliphatic polyhydric alcohol compound or an amide of an unsaturated carboxylic acid and an aliphatic polyamine compound are preferably used. Furthermore, an addition reaction product of an unsaturated carboxylic acid ester or amide having a nucleophilic substituent such as a hydroxyl group, an amino group, or a mercapto group with a monofunctional or polyfunctional isocyanate or epoxy, a dehydration-condensation reaction product with a monofunctional or polyfunctional carboxylic acid, etc. may also be used suitably. Furthermore, an addition reaction product of an unsaturated carboxylic acid ester or amide having an electrophilic substituent such as an isocyanate group or an epoxy group with a monofunctional or polyfunctional alcohol, amine, or thiol, and a substitution reaction product of an unsaturated carboxylic acid ester or amide having a leaving substituent such as a halogen group or a tosyloxy group with a monofunctional or polyfunctional alcohol, amine, or thiol are also suitable. Furthermore, as other examples, a group of compounds in which the above-mentioned unsaturated carboxylic acid is replaced by an unsaturated phosphonic acid, styrene, vinyl ether, etc. may also be used.

Specific examples of ester monomers of an aliphatic polyhydric alcohol compound and an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl) isocyanurate, a polyester acrylate oligomer, and an EO-modified isocyanurate triacrylate.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane, and bis[p-(methacryloxyethoxy) phenyl]dimethylmethane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of crotonic acid esters include ethylene glycol dicrotonate, tetramethylene glycol dicrotonate, pentaerythritol dicrotonate, and sorbitol tetradicrotonate. Examples of isocrotonic acid esters include ethylene glycol diisocrotonate, pentaerythritol diisocrotonate, and sorbitol tetraisocrotonate.

Examples of maleic acid esters include ethylene glycol dimaleate, triethylene glycol dimaleate, pentaerythritol dimaleate, and sorbitol tetramaleate.

As examples of other esters, aliphatic alcohol-based esters described in JP-B-51-47334 (JP-B denotes a Japanese examined patent application publication) and JP-A-57-196231, those having an aromatic skeleton described in JP-A-59-5240, JP-A-59-5241, and JP-A-2-226149, those having an amino group described in JP-A-1-165613, etc. may also be used suitably. Moreover, the above-mentioned ester monomers may be used as a mixture.

Furthermore, specific examples of amide monomers of an aliphatic polyamine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide.

Preferred examples of other amide-based monomers include those having a cyclohexylene structure described in JP-B-54-21726.

Furthermore, a urethane-based addition-polymerizable compound produced by an addition reaction of an isocyanate and a hydroxy group is also suitable, and specific examples thereof include a vinylurethane compound containing two or more polymerizable vinyl groups per molecule in which a hydroxy group-containing vinyl monomer represented by Formula (A) below is added to a polyisocyanate compound having two or more isocyanate groups per molecule described in JP-B-48-41708.

$$CH_2=C(R^4)COOCH_2CH(R^5)OH \qquad (A)$$

(In Formula (A), $R^4$ and $R^5$ independently denote H or $CH_3$.)

Furthermore, urethane acrylates described in JP-A-51-37193, JP-B-2-32293, and JP-B-2-16765, and urethane compounds having an ethylene oxide-based skeleton described in JP-B-58-49860, JP-B-56-17654, JP-B-62-39417, JP-B-62-39418 are also suitable. Furthermore, by use of an addition-polymerizable compound having an amino structure or a sulfide structure in the molecule described in JP-A-63-277653, JP-A-63-260909, and JP-A-1-105238, a photosensitive resin composition having very good photosensitive speed can be obtained.

Other examples include polyester acrylates such as those described in JP-A-48-64183, JP-B-49-43191, and JP-B-52-30490, and polyfunctional acrylates and methacrylates such as epoxy acrylates formed by a reaction of an epoxy resin and (meth)acrylic acid. Examples also include specific unsaturated compounds described in JP-B-46-43946, JP-B-1-40337, and JP-B-1-40336, and vinylphosphonic acid-based compounds described in JP-A-2-25493. In some cases, perfluoroalkyl group-containing structures described in JP-A-61-22048 are suitably used. Moreover, those described as photocuring monomers or oligomers in the Journal of the Adhesion Society of Japan, Vol. 20, No. 7, pp. 300 to 308 (1984) may also be used.

With regard to these polymerizable compounds, the structure thereof and details of an application method such as use thereof on their own or in combination and the amount thereof added may be freely set according to the eventual performance design of a photosensitive resin composition. For example, selection is carried out from the following viewpoints.

From the viewpoint of sensitivity, a structure having a large unsaturated group content per molecule is preferable, and in many cases di- or higher-functionality is preferable. Furthermore, in order to increase the strength of a cured coating, tri- or higher-functionality is better, and it is also effective to adjust both sensitivity and strength by using in combination different functionality/different polymerizable groups (e.g. an acrylic acid ester, a methacrylic acid ester, a styrene-based compound, a vinyl ether-based compound).

Furthermore, selection and application methods of the polymerizable compound are important factors for compatibility and dispersibility with other components (e.g. a photopolymerization initiator, titanium black, resin, etc.) contained in the photosensitive resin composition and, for example, the compatibility can be improved by the use of a low purity compound or the use of two or more types in combination. Moreover, in order to improve adhesion to a hard surface such as a substrate, a specific structure can be selected.

The content of the polymerizable compound (total content of two or more types) in the total solids content of the photosensitive resin composition of the present invention is not particularly limited, but from the viewpoint of obtaining the effects of the present invention effectively, it is preferably 10 to 80 wt %, more preferably 15 to 75 wt %, and particularly preferably 20 to 60 wt %.

In the present invention, two or more types of polymerizable compounds are used in combination. Three or more types of polymerizable compounds may be used in combination. With regard to the two or more types of polymerizable compounds, it is preferable to use in combination two or more types of ethylenically unsaturated compounds having different numbers of ethylenically unsaturated groups present per molecule (functionality).

The ratio by weight of the polymerizable compounds used in combination is not particularly limited, but when two types of polymerizable compounds are used, it is preferably 95:5 to 5:95, more preferably 80:20 to 20:80, and yet more preferably 70:30 to 30:70. When three or more types of polymerizable compounds are used in combination, it is preferable that the ratio by weight of any two types of polymerizable compounds is within the above-mentioned range.

Furthermore, the polymerizable compound is preferably a full (meth)acrylic acid ester of an aliphatic polyol having hydroxy groups in the molecule. The polymerizable compound is more preferably a full acrylic acid ester of a fatty acid polyol having hydroxy groups in the molecule.

Examples of full (meth)acrylic acid esters of a difunctional aliphatic polyol include ethylene glycol di(meth)acrylate, 1,3-butanediol di(meth)acrylate, diethylene glycol di(meth) acrylate, triethylene glycol di(meth)acrylate, tetraethylene glycol di(meth)acrylate, neopentyl glycol di(meth)acrylate, hexanediol di(meth)acrylate, 1,4-cyclohexanediol di(meth) acrylate, and a polyethylene glycol di(meth)acrylate having an average molecular weight in the range of 200 to 2,000.

Examples of full (meth)acrylic acid esters of a trifunctional aliphatic polyol include trimethylolpropane tri(meth)acrylate, trimethylolethane tri(meth)acrylate, alkylene oxide-modified trimethylolpropane tri(meth)acrylate, trimethylolpropane tri((meth)acryloyloxypropyl)ether, alkylene oxide-modified isocyanurate tri(meth)acrylate, and tri((meth) acryloyloxyethyl)isocyanurate.

Examples of full (meth)acrylic acid esters of a tetrafunctional aliphatic polyol include pentaerythritol tetra(meth) acrylate, examples of full (meth)acrylic acid esters of a hexafunctional aliphatic polyol include dipentaerythritol hexa(meth)acrylate and sorbitol hexaacrylate, and examples of full (meth)acrylic acid esters of an octafunctional aliphatic polyol include tripentaerythritol octa(meth)acrylate.

In the present invention, it is more preferable to use in combination ethylenically unsaturated compounds having different functionality selected from di- to hexa-functionality, and it is yet more preferable to use in combination two types selected from tetra- to hexa-functional (meth)acrylic acid esters that are the full (meth)acrylic acid esters of aliphatic polyols.

Among them, it is preferable for a (meth)acrylic acid ester of pentaerythritol and/or dipentaerythritol to be contained, and it is more preferable for (meth)acrylic acid esters of pentaerythritol and dipentaerythritol to be contained. As a particularly preferred mode, a mode in which a full (meth) acrylic acid ester of pentaerythritol and a full (meth)acrylic acid ester of dipentaerythritol are contained can be cited and, furthermore, a mode in which pentaerythritol tetraacrylate and dipentaerythritol hexaacrylate are contained can be cited.

(C) Resin

The photosensitive resin composition of the present invention comprises a resin as a binder (film-forming agent). This resin is preferably an alkali-soluble resin.

As the resin, a linear organic polymer is preferably used. As such a 'linear organic polymer', any known polymer may be used. In order to enable aqueous development or weakly alkaline aqueous development, a linear organic polymer that is soluble or swellable in water or weakly alkaline water is preferably selected. The linear organic polymer is selected and used according to an intended application not only as a film-forming agent but also as an aqueous, weakly alkaline aqueous, or organic solvent developing agent. For example, when a water-soluble organic polymer is used, aqueous development becomes possible. Examples of such a linear organic polymer include radical polymers having a carboxylic acid group in a side chain such as those described in JP-A-59-44615, JP-B-54-34327, JP-B-58-12577, JP-B-54-25957, JP-A-54-92723, JP-A-59-53836, and JP-A-59-71048, that is, a resin formed by homopolymerization or copolymerization of a carboxyl group-containing monomer, a resin formed by hydrolysis, half esterification, or half amidation of an acid anhydride unit of a homopolymer or copolymer of an acid anhydride-containing monomer, and an epoxy acrylate in which an epoxy resin is modified with an unsaturated monocarboxylic acid or acid anhydride. As the carboxyl group-containing monomer there can be cited acrylic acid, methacrylic acid, itaconic acid, crotonic acid, maleic acid, fumaric acid, and 4-carboxylstyrene, and as the acid anhydride-containing monomer there can be cited maleic anhydride.

Similarly, there is an acidic cellulose derivative having a carboxylic acid group in a side chain. In addition thereto, one formed by adding a cyclic acid anhydride to a polymer having a hydroxy group is also useful.

When a copolymer is used as the resin (e.g. an alkali-soluble resin) in the present invention, a monomer other than the above-mentioned monomers may be used as a compound that is copolymerized. Examples of said other monomer include compounds (1) to (12) below.

(1) Acrylic acid esters and methacrylic acid esters having an aliphatic hydroxy group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate.

(2) Acrylic acid esters that do not have an aliphatic hydroxy group, such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate.

(3) Methacrylic acid esters that do not have an aliphatic hydroxy group, such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl methacrylate.

(4) Acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide.
(5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.
(6) Vinyl esters such as vinyl acetate, vinyl chloroacetate, vinyl butyrate, and vinyl benzoate.
(7) Styrenes such as styrene, α-methylstyrene, methylstyrene, chloromethylstyrene, and p-acetoxystyrene.
(8) Vinyl ketones such as methyl vinyl ketone, ethyl vinyl ketone, propyl vinyl ketone, and phenyl vinyl ketone.
(9) Olefins such as ethylene, propylene, isobutylene, butadiene, and isoprene.
(10) N-Vinylpyrrolidone, acrylonitrile, and methacrylonitrile.
(11) Unsaturated imides such as maleimide, N-acryloylacrylamide, N-acetylmethacrylamide, N-propionylmethacrylamide, and N-(p-chlorobenzoyl)methacrylamide.
(12) Methacrylic acid-based monomers in which a hetero atom is bonded to the α-position, such as compounds described in JP-A-2002-309057 and JP-A-2002-311569.

Among them, (meth)acrylic resins having an allyl group or vinyl ester group and a carboxyl group in a side chain, alkali-soluble resins having a double bond in a side chain described in JP-A-2000-187322 and JP-A-2002-62698, and alkali-soluble resins having an amide group in a side chain described in JP-A-2001-242612 are suitable since the balance between film strength, sensitivity, and developability is excellent.

Furthermore, acid group-containing urethane-based binder polymers described in JP-B-7-12004, JP-B-7-120041, JP-B-7-120042, JP-B-8-12424, JP-A-63-287944, JP-A-63-287947, and JP-A-1-271741, and urethane-based binder polymers having an acid group and a double bond in a side chain described in JP-A-2002-107918 are advantageous in terms of printing durability and low exposure suitability since the strength is very good.

Furthermore, acid group-containing acetal-modified polyvinyl alcohol-based binder polymers described in European Patent No. 993966, European Patent No. 1204000, and JP-A-2001-318463 are suitable since the balance between film strength and developability is excellent.

In addition to the above, as a water-soluble linear organic polymer, polyvinylpyrrolidone, polyethylene oxide, etc. are useful. Furthermore, in order to increase the strength of a cured film, an alcohol-soluble nylon or a polyether of 2,2-bis(4-hydroxyphenyl)propane and epichlorohydrin is also useful.

In the present invention, among the resins described above, resins having a polymerizable group-containing monomer unit and an acidic group-containing monomer unit are preferable. As the polymerizable group-containing monomer unit, an ethylenically unsaturated group-containing monomer unit is preferable, and a monomer unit having an acryloyloxy group or a methacryloyloxy group in a side chain is more preferable. As the acidic group-containing monomer unit, a sulfonic acid group- or carboxyl group-containing monomer unit is preferable, and a monomer unit derived from acrylic acid or methacrylic acid is preferable.

The weight-average molecular weight of the resin contained in the photosensitive resin composition of the present invention is preferably at least 5,000, and more preferably in the range of 10,000 to 300,000, and the number-average molecular weight is preferably greater than 2,000, and more preferably in the range of 3,000 to 250,000. The polydispersity (weight-average molecular weight/number-average molecular weight) is preferably at least 1, and more preferably in the range of 1.1 to 10.

These resins may be any of a random polymer, a block polymer, a graft polymer, etc.

The resin in the present invention may be synthesized by a conventionally known method. Examples of a solvent used in synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, and water. These solvents may be used on their own or as a mixture of two or more types.

As a radical polymerization initiator used when synthesizing the resin in the present invention, a known compound such as an azo type initiator or a peroxide initiator can be cited.

The resin content (when two or more types are used, the total content) in the total solids content of the photosensitive resin composition of the present invention is not particularly limited, but from the viewpoint of obtaining the effects of the present invention more effectively, it is preferably 5 to 50 wt %, more preferably 10 to 40 wt %, and particularly preferably 10 to 35 wt %.

(D) Photopolymerization Initiator

The photosensitive resin composition of the present invention comprises a photopolymerization initiator.

The photopolymerization initiator is not particularly limited as long as it can photopolymerize the above-mentioned polymerizable compound, but it is preferably selected from the viewpoint of properties, initiation efficiency, absorption wavelength, availability, cost, etc.

The photopolymerization initiator that can be used in the present invention is a compound that generates a polymerization initiating species by absorbing actinic radiation (light). Examples of the actinic radiation include γ rays, β rays, an electron beam, UV rays, visible light, and IR rays.

Examples of the photopolymerization initiator include at least one active halogen compound selected from a halomethyloxadiazole compound and a halomethyl-s-triazine compound, a 3-aryl-substituted coumarin compound, lophine dimer, a benzophenone compound, an acetophenone compound and a derivative thereof, a cyclopentadiene-benzene-iron complex and a salt thereof, and an oxime-based compound.

Examples of the halomethyloxadiazole compound include a 2-halomethyl-5-vinyl-1,3,4-oxadiazole compound, etc. described in JP-B-57-6096, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

Examples of the halomethyl-s-triazine compound include a vinylhalomethyl-s-triazine compound described in JP-B-59-12817 a 2-(naphtho-1-yl)-4,6-bishalomethyl-s-triazine compound described in JP-A-53-133428, and a 4-(p-aminophenyl)-2,6-dihalomethyl-s-triazine compound.

Specific examples of the halomethyl-s-triazine compound include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2-(4-ethoxynaphtho-1-yl)-4,6-bis(trichloromethyl)-s-triazine, 2-(4-butoxynaphtho-1-yl)-4,6-bis(trichloromethyl)-s-triazine, 2-[4-(2-methoxyethyl)naphtho-1-yl]-4,6-bis(trichloromethyl)-s-triazine, 2-[4-(2-ethoxyethyl)naphtho-1-yl]-4,6-bis(trichloromethyl)-s-triazine, 2-[4-(2-butoxyethyl)naphtho-1-yl]-4,6-bis(trichloromethyl)-s-triazine, 2-(2-methoxynaphtho-1-yl)-4,6-bis(trichloromethyl)-s-triazine, 2-(6-methoxy-5-methylnaphtho-2-yl)-4,6-bis(trichloromethyl)-s-triazine, 2-(6-methoxynaphtho-2-yl)-4,6-bis(trichloromethyl)-s-triazine, 2-(5-methoxynaphtho-1-yl)-4,6-bis(trichloromethyl)-s-triazine, 2-(4,7-dimethoxynaphtho-1-yl)-4,6-bis(trichloromethyl)-s-triazine, 2-(6-ethoxynaphtho-2-yl)-4,6-bistrichloromethyl-s-triazine, 2-(4,5-dimethoxynaphtho-1-yl)-4,6-bis(trichloromethyl)-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

In addition thereto, the TAZ series manufactured by Midori Kagaku Co., Ltd. (e.g. TAZ-107, TAZ-110, TAZ-104, TAZ-109, TAZ-140, TAZ-204, TAZ-113, TAZ-123), the T series manufactured by PANCHIM (e.g. T-OMS, T-BMP, T-R, T-B), the IRGACURE series manufactured by Ciba Specialty Chemicals (e.g. IRGACURE 651, IRGACURE 184, IRGACURE 500, IRGACURE 1000, IRGACURE 149, IRGACURE 819, IRGACURE 261), the DAROCUR series manufactured by Ciba Specialty Chemicals (e.g. DAROCUR 1173), 4,4'-bis(diethylamino)benzophenone, 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, 2-benzyl-2-dimethylamino-4-morpholinobutyrophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, benzoin isopropyl ether, etc. may also suitably be used.

As the photopolymerization initiator, a compound not having a halogen atom is preferable, and an initiator having high sensitivity toward i rays is preferable; examples thereof include lophine dimer and an oxime-based compound. As the oxime-based compound, an oxime ester-based compound is more preferable.

Among the oxime-based photopolymerization initiators, 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl]ethanone are preferable.

Furthermore, as the oxime-based photopolymerization initiator, a compound represented by Formula (1) below (hereinafter, also called a 'specific oxime compound') is preferable. In addition, the specific oxime compound may be an oxime compound in which the N—O bond of the oxime is in the (E) form or an oxime compound in which the N—O bond of the oxime is in the (Z) form, or a mixture of the (E) form and the (Z) form.

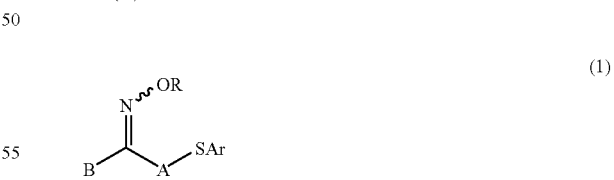

(1)

(In Formula (1), R and B independently denote a monovalent substituent, A denotes a divalent organic group, and Ar denotes an aryl group.)

The monovalent substituent denoted by R is preferably a monovalent non-metallic atomic group.

Examples of the monovalent non-metallic atomic group include an alkyl group, an aryl group, an alkenyl group, an alkynyl group, an alkylsulfinyl group, an arylsulfinyl group, an alkylsulfonyl group, an arylsulfonyl group, an acyl group, an alkoxycarbonyl group, an aryloxycarbonyl group, a phosphinoyl group, a heterocyclic group, an alkylthiocarbonyl group, an arylthiocarbonyl group, a dialkylaminocarbonyl group, and a dialkylaminothiocarbonyl group. These groups may have one or more substituents. The substituent may further be substituted by another substituent.

Examples of the substituent include halogen atoms such as a fluorine atom, a chlorine atom, a bromine atom, and an iodine atom, alkoxy groups such as a methoxy group, an ethoxy group, and a tert-butoxy group, aryloxy groups such as a phenoxy group and a p-tolyloxy group, alkoxycarbonyl and aryloxycarbonyl groups such as a methoxycarbonyl group, a butoxycarbonyl group, and a phenoxycarbonyl group, acyloxy groups such as an acetoxy group, a propionyloxy group, and a benzoyloxy group, acyl groups such as an acetyl group, a benzoyl group, an isobutyryl group, an acryloyl group, a methacryloyl group, and a methoxalyl group, alkylsulfanyl groups such as a methylsulfanyl group and a tert-butylsulfanyl group, arylsulfanyl groups such as a phenylsulfanyl group and a p-tolylsulfanyl group, alkylamino groups such as a methylamino group and a cyclohexylamino group, dialkylamino groups such as a dimethylamino group, a diethylamino group, a morpholino group, and a piperidino group, arylamino groups such as a phenylamino group and a p-tolylamino group, alkyl groups such as a methyl group, an ethyl group, a tert-butyl group, and a dodecyl group, and aryl groups such as a phenyl group, a p-tolyl group, a xylyl group, a cumenyl group, a naphthyl group, an anthryl group, and a phenanthryl group, as well as a hydroxy group, a carboxy group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphono group, a trimethylammonium group, a dimethylsulfonium group, and a triphenylphenacylsulfonium group.

The optionally substituted alkyl group is preferably an alkyl group having 1 to 30 carbons, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The optionally substituted aryl group is preferably an aryl group having 6 to 30 carbons, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, o-, m-, and p-tolyl groups, a xylyl group, o-, m-, and p-cumenyl groups, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The optionally substituted alkenyl group is preferably an alkenyl group having 2 to 10 carbons, and specific examples thereof include a vinyl group, an allyl group, and a styryl group.

The optionally substituted alkynyl group is preferably an alkynyl group having 2 to 10 carbons, and specific examples thereof include an ethynyl group, a propynyl group, and a propargyl group.

The optionally substituted alkylsulfinyl group is preferably an alkylsulfinyl group having 1 to 20 carbons, and specific examples thereof include a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanoylsulfinyl group, an octadecanoylsulfinyl group, a cyanomethylsulfinyl group, and a methoxymethylsulfinyl group.

The optionally substituted arylsulfinyl group is preferably an arylsulfinyl group having 6 to 30 carbons, and specific examples thereof include a phenylsulfinyl group, a 1-naphthylsulfinyl group, a 2-naphthylsulfinyl group, a 2-chlorophenylsulfinyl group, a 2-methylphenylsulfinyl group, a 2-methoxyphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methoxyphenylsulfinyl group, a 4-methylsulfanylphenylsulfinyl group, a 4-phenylsulfanylphenylsulfinyl group, and a 4-dimethylaminophenylsulfinyl group.

The optionally substituted alkylsulfonyl group is preferably an alkylsulfonyl group having 1 to 20 carbons, and specific examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, and a perfluoroalkylsulfonyl group.

The optionally substituted arylsulfonyl group is preferably an arylsulfonyl group having 6 to 30 carbons, and specific examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

The optionally substituted acyl group is preferably an acyl group having 2 to 20 carbons, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The optionally substituted alkoxycarbonyl group is preferably an alkoxycarbonyl group having 2 to 20 carbons, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the optionally substituted aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The optionally substituted phosphinoyl group is preferably a phosphinoyl group having 2 to 50 carbons, and specific examples thereof include a dimethylphosphinoyl group, a diethylphosphinoyl group, a dipropylphosphinoyl group, a diphenylphosphinoyl group, a dimethoxyphosphinoyl group, a diethoxyphosphinoyl group, a dibenzoylphosphinoyl group, and a bis(2,4,6-trimethylphenyl)phosphinoyl group.

The optionally substituted heterocyclic group is preferably a nitrogen atom-, oxygen atom-, sulfur atom-, or phosphorus atom-containing aromatic or aliphatic heterocycle.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolidinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Specific examples of the optionally substituted alkylthiocarbonyl group include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the optionally substituted arylthiocarbonyl group include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

Specific examples of the optionally substituted dialkylaminocarbonyl group include a dimethylaminocarbonyl group, a diethylaminocarbonyl group, a dipropylaminocarbonyl group, and a dibutylaminocarbonyl group.

Specific examples of the optionally substituted dialkylaminothiocarbonyl group include a dimethylaminothiocarbonyl group, a dipropylaminothiocarbonyl group, and a dibutylaminothiocarbonyl group.

Among them, from the viewpoint of high sensitivity, R is more preferably an acyl group, and specific preferred examples thereof include an acetyl group, a propanoyl group, a benzoyl group, and a toluoyl group.

The monovalent substituent denoted by B above represents an aryl group, a heterocyclic group, an arylcarbonyl group, or a heterocyclic carbonyl group. These groups may have one or more substituents. As the substituent, the above-mentioned substituents can be cited. The above-mentioned substituents may further be substituted by another substituent.

Among them, the structures shown below are particularly preferable.

In the structures below, Y, X, and n have the same meanings as those of Y, X, and n respectively in Formula (2), which is described later, and preferred examples are also the same.

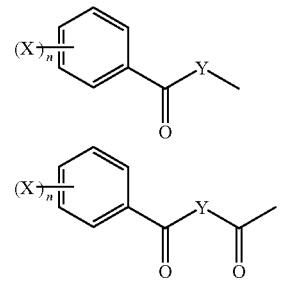

As the divalent organic group denoted by A above, alkylene, cyclohexylene, and alkynylene groups having 1 to 12 carbons can be cited. Furthermore, these groups may have one or more substituents. As the substituent, the above-mentioned substituents can be cited. The above-mentioned substituents may further be substituted by another substituent.

Among them, from the viewpoint of enhancing sensitivity and suppressing coloration due to heating over time, A is preferably an unsubstituted alkylene group, an alkyl group (e.g. methyl group, ethyl group, tert-butyl group, dodecyl group)-substituted alkylene group, an alkenyl group (e.g. vinyl group, allyl group)-substituted alkylene group, or an aryl group (e.g. phenyl group, p-tolyl group, xylyl group, cumenyl group, naphthyl group, anthryl group, phenanthryl group, styryl group)-substituted alkylene group.

The aryl group denoted by Ar is preferably an aryl group having 6 to 30 carbons, and may have a substituent. As the substituent, the above-mentioned substituents can be cited.

Specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarterphenyl group, o-, m-, and p-tolyl groups, a xylyl group, o-, m-, and p-cumenyl groups, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

Among them, from the viewpoint of enhancing sensitivity and suppressing coloration due to heating over time, a substituted or unsubstituted phenyl group is preferable.

In Formula (1), from the viewpoint of sensitivity the structure of 'SAr' formed by the Ar and the adjacent S is preferably a structure shown below. Me denotes a methyl group, and Et denotes an ethyl group.

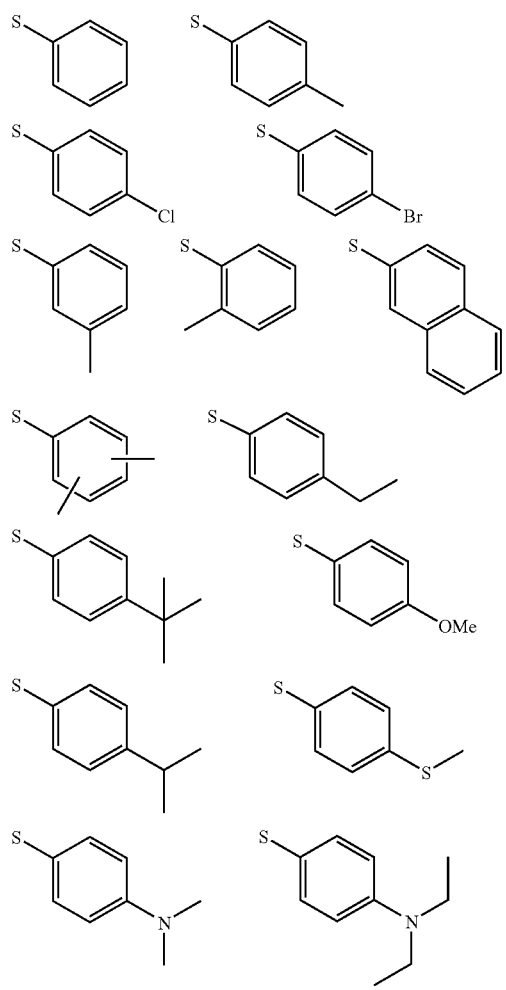

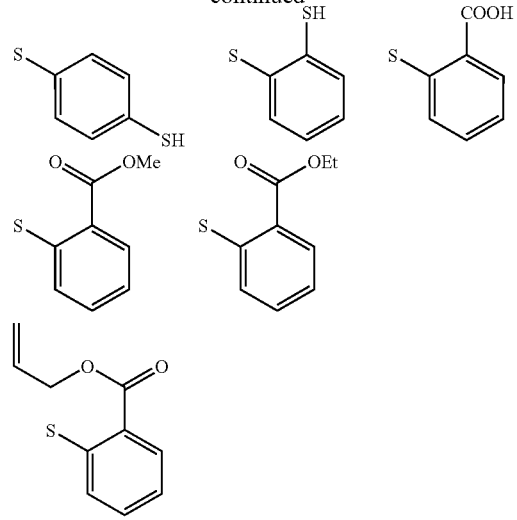

The specific oxime compound in the present invention is preferably a compound represented by Formula (2) below.

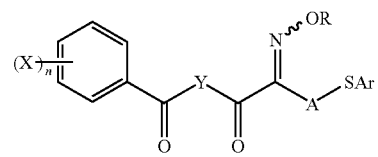

(In Formula (2), R and X independently denote a monovalent substituent, A and Y independently denote a divalent organic group, Ar denotes an aryl group, and n is an integer of 0 to 5.)

R, A, and Ar in Formula (2) have the same meanings as those of R, A, and Ar in Formula (1) above, and preferred examples are also the same.

As the monovalent substituent denoted by X, an alkyl group, an aryl group, an alkenyl group, an alkynyl group, an alkoxy group, an aryloxy group, an acyloxy group, an alkylsulfanyl group, an arylsulfanyl group, an alkylsulfinyl group, an arylsulfinyl group, an alkylsulfonyl group, an arylsulfonyl group, an acyl group, an alkoxycarbonyl group, a carbamoyl group, a sulfamoyl group, an amino group, a phosphinoyl group, a heterocyclic group, and a halogen atom can be cited. These groups may have one or more substituents. As the substituent, the above-mentioned substituents can be cited as examples. The above-mentioned substituent may further be substituted by another substituent.

The alkyl group, aryl group, alkenyl group, alkynyl group, alkylsulfinyl group, arylsulfinyl group, alkylsulfonyl group, arylsulfonyl group, acyl group, alkoxycarbonyl group, aryloxycarbonyl group, phosphinoyl group, and heterocyclic group denoted by X above have the same meanings as the alkyl group, aryl group, alkenyl group, alkynyl group, alkylsulfinyl group, arylsulfinyl group, alkylsulfonyl group, arylsulfonyl group, acyl group, alkoxycarbonyl group, aryloxycarbonyl group, phosphinoyl group, and heterocyclic group denoted by R in Formula (1) above, and preferred ranges are also the same.

The alkoxy group is preferably an alkoxy group having 1 to 30 carbons, and specific examples thereof include a methoxy group, an ethoxy group, a propyloxy group, an isopropyloxy group, a butoxy group, an isobutoxy group, a sec-butoxy group, a tert-butoxy group, a pentyloxy group, an isopentyloxy group, a hexyloxy group, a heptyloxy group, an octyloxy group, a 2-ethylhexyloxy group, a decyloxy group, a dodecyloxy group, an octadecyloxy group, an ethoxycarbonylmethyl group, a 2-ethylhexyloxycarbonylmethyloxy group, an aminocarbonylmethyloxy group, an N,N-dibutylaminocarbonylmethyloxy group, an N-methylaminocarbonylmethyloxy group, an N-ethylaminocarbonylmethyloxy group, an N-octylaminocarbonylmethyloxy group, an N-methyl-N-benzylaminocarbonylmethyloxy group, a benzyloxy group, and a cyanomethyloxy group.

The aryloxy group is preferably an aryloxy group having 6 to 30 carbons, and specific examples thereof include a phenyloxy group, a 1-naphthyloxy group, a 2-naphthyloxy group, a 2-chlorophenyloxy group, a 2-methylphenyloxy group, a 2-methoxyphenyloxy group, a 2-butoxyphenyloxy group, a 3-chlorophenyloxy group, a 3-trifluoromethylphenyloxy group, a 3-cyanophenyloxy group, a 3-nitrophenyloxy group, a 4-fluorophenyloxy group, a 4-cyanophenyloxy group, a 4-methoxyphenyloxy group, a 4-dimethylaminophenyloxy group, a 4-methylsulfanylphenyloxy group, and a 4-phenylsulfanylphenyloxy group.

The acyloxy group is preferably an acyloxy group having 2 to 20 carbons, and specific examples thereof include an acetyloxy group, a propanoyloxy group, a butanoyloxy group, a pentanoyloxy group, a trifluoromethylcarbonyloxy group, a benzoyloxy group, a 1-naphthylcarbonyloxy group, and a 2-naphthylcarbonyloxy group.

The alkylsulfanyl group is preferably an alkylsulfanyl group having 1 to 20 carbons, and specific examples thereof include a methylsulfanyl group, an ethylsulfanyl group, a propylsulfanyl group, an isopropylsulfanyl group, a butylsulfanyl group, a hexylsulfanyl group, a cyclohexylsulfanyl group, an octylsulfanyl group, a 2-ethylhexylsulfanyl group, a decanoylsulfanyl group, a dodecanoylsulfanyl group, an octadecanoylsulfanyl group, a cyanomethylsulfanyl group, and a methoxymethylsulfanyl group.

The arylsulfanyl group is preferably an arylsulfanyl group having 6 to 30 carbons, and specific examples thereof include a phenylsulfanyl group, a 1-naphthylsulfanyl group, a 2-naphthylsulfanyl group, a 2-chlorophenylsulfanyl group, a 2-methylphenylsulfanyl group, a 2-methoxyphenylsulfanyl group, a 2-butoxyphenylsulfanyl group, a 3-chlorophenylsulfanyl group, a 3-trifluoromethylphenylsulfanyl group, a 3-cyanophenylsulfanyl group, a 3-nitrophenylsulfanyl group, a 4-fluorophenylsulfanyl group, a 4-cyanophenylsulfanyl group, a 4-methoxyphenylsulfanyl group, a 4-methylsulfanylphenylsulfanyl group, a 4-phenylsulfanylphenylsulfanyl group, and a 4-dimethylaminophenylsulfanyl group.

The carbamoyl group is preferably a carbamoyl group having a total of 1 to 30 carbons, and specific examples thereof include an N-methylcarbamoyl group, an N-ethylcarbamoyl group, an N-propylcarbamoyl group, an N-butylcarbamoyl group, an N-hexylcarbamoyl group, an N-cyclohexylcarbamoyl group, an N-octylcarbamoyl group, an N-decylcarbamoyl group, an N-octadecylcarbamoyl group, an N-phenylcarbamoyl group, an N-2-methylphenylcarbamoyl group, an N-2-chlorophenylcarbamoyl group, an N-2-isopropoxyphenylcarbamoyl group, an N-2-(2-ethylhexyl)phenylcarbamoyl group, an N-3-chlorophenylcarbamoyl group, an N-3-nitrophenylcarbamoyl group, an N-3-cyanophenylcarbamoyl group, an N-4-methoxyphenylcarbamoyl group, an N-4-cyanophenylcarbamoyl group, an N-4-methylsulfanylphenylcarbamoyl group, an N-4-phenylsulfanylphenylcarbamoyl group, an N-methyl-N-phenylcarbamoyl group, an N,N-dimethylcarbamoyl group, an N,N-dibutylcarbamoyl group, and an N,N-diphenylcarbamoyl group.

The sulfamoyl group is preferably a sulfamoyl group having a total of 0 to 30 carbons, and specific examples thereof include a sulfamoyl group, an N-alkylsulfamoyl group, an N-arylsulfamoyl group, an N,N-dialkylsulfamoyl group, an N,N-diarylsulfamoyl group, and an N-alkyl-N-arylsulfamoyl group. More specific preferred examples thereof include an N-methylsulfamoyl group, an N-ethylsulfamoyl group, an N-propylsulfamoyl group, an N-butylsulfamoyl group, an N-hexylsulfamoyl group, an N-cyclohexylsulfamoyl group, an N-octylsulfamoyl group, an N-2-ethylhexylsulfamoyl group, an N-decylsulfamoyl group, an N-octadecylsulfamoyl group, an N-phenylsulfamoyl group, an N-2-methylphenylsulfamoyl group, an N-2-chlorophenyl sulfamoyl group, an N-2-methoxyphenylsulfamoyl group, an N-2-isopropoxyphenylsulfamoyl group, an N-3-chlorophenylsulfamoyl group, an N-3-nitrophenylsulfamoyl group, an N-3-cyanophenylsulfamoyl group, an N-4-methoxyphenylsulfamoyl group, an N-4-cyanophenylsulfamoyl group, an N-4-dimethylaminophenylsulfamoyl group, an N-4-methylsulfanylphenylsulfamoyl group, an N-4-phenylsulfanylphenylsulfamoyl group, an N-methyl-N-phenylsulfamoyl group, an N,N-dimethylsulfamoyl group, an N,N-dibutylsulfamoyl group, and an N,N-diphenylsulfamoyl group.

The amino group is preferably an amino group having a total of 0 to 50 carbons, and specific examples thereof include an amino group (—NH$_2$), an N-alkylamino group, an N-arylamino group, an N-acylamino group, an N-sulfonylamino group, an N,N-dialkylamino group, an N,N-diarylamino group, an N-alkyl-N-arylamino group, and an N,N-disulfonylamino group. More specific preferred examples thereof include an N-methylamino group, an N-ethylamino group, an N-propylamino group, an N-isopropylamino group, an N-butylamino group, an N-tert-butylamino group, an N-hexylamino group, an N-cyclohexylamino group, an N-octylamino group, an N-2-ethylhexylamino group, an N-decylamino group, an N-octadecylamino group, an N-benzylamino group, an N-phenylamino group, an N-2-methylphenylamino group, an N-2-chlorophenylamino group, an N-2-methoxyphenylamino group, an N-2-isopropoxyphenylamino group, an N-2-(2-ethylhexyl)phenylamino group, an N-3-chlorophenylamino group, an N-3-nitrophenylamino group, an N-3-cyanophenylamino group, an N-3-trifluoromethylphenylamino group, an N-4-methoxyphenylamino group, an N-4-cyanophenylamino group, an N-4-trifluoromethylphenylamino group, an N-4-methylsulfanylphenylamino group, an N-4-phenylsulfanylphenylamino group, an N-4-dimethylaminophenylamino group, an N-methyl-N-phenylamino group, an N,N-dimethylamino group, an N,N-diethylamino group, an N,N-dibutylamino group, an N,N-diphenylamino group, an N,N-diacetylamino group, an N,N-dibenzoylamino group, an N,N-(dibutylcarbonyl)amino group, an N,N-(dimethylsulfonyl)amino group, an N,N-(diethylsulfonyl)amino group, an N,N-(dibutylsulfonyl)amino group, an N,N-(diphenylsulfonyl)amino group, a morpholino group, a 3,5-dimethylmorpholino group, and a carbazole group.

As the halogen atom, a fluorine atom, a chlorine atom, a bromine atom, and an iodine atom can be cited.

Among them, from the viewpoint of solvent solubility and improvement of absorption efficiency in a long wavelength region, X is preferably an alkyl group, an aryl group, an alkenyl group, an alkynyl group, an alkoxy group, an aryloxy group, an alkylsulfanyl group, an arylsulfanyl group, or an amino group.

Furthermore, n in Formula (2) denotes an integer of 0 to 5, and preferably an integer of 0 to 2.

As the divalent organic group denoted by Y above, the structures shown below can be cited. In the group shown below, "*" denotes a bonding position to a carbon atom adjacent to Y in Formula (2) above.

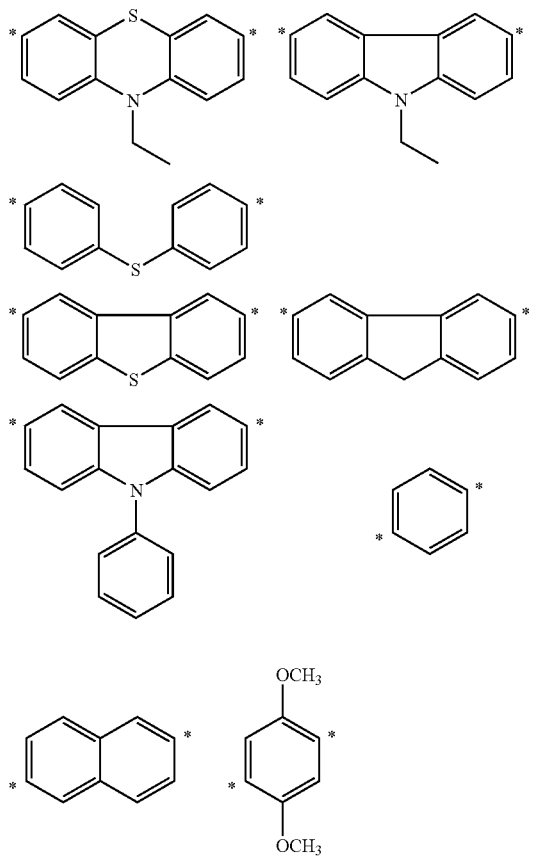

Among them, from the viewpoint of high sensitivity, the structures shown below are preferable.

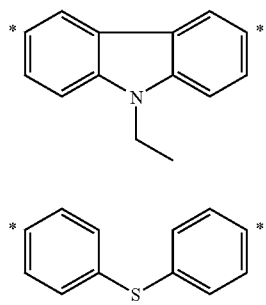

The specific oxime compound in the present invention is preferably a compound represented by Formula (3) below.

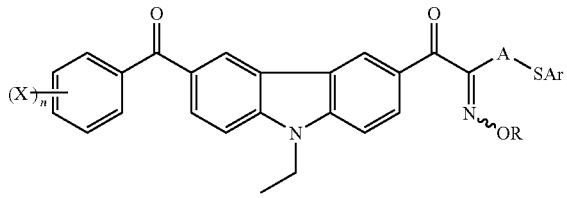

(In Formula (3), R and X independently denote a monovalent substituent, A denotes a divalent organic group, Ar denotes an aryl group, and n is an integer of 0 to 5.)

R, X, A, Ar, and n in Formula (3) have the same meanings as those of R, X, A, Ar, and n in Formula (2) above, and preferred examples are also the same.

Specific examples (K-1) to (K-88) of the specific oxime compound in the present invention are shown below, but the present invention should not be construed as being limited thereto.

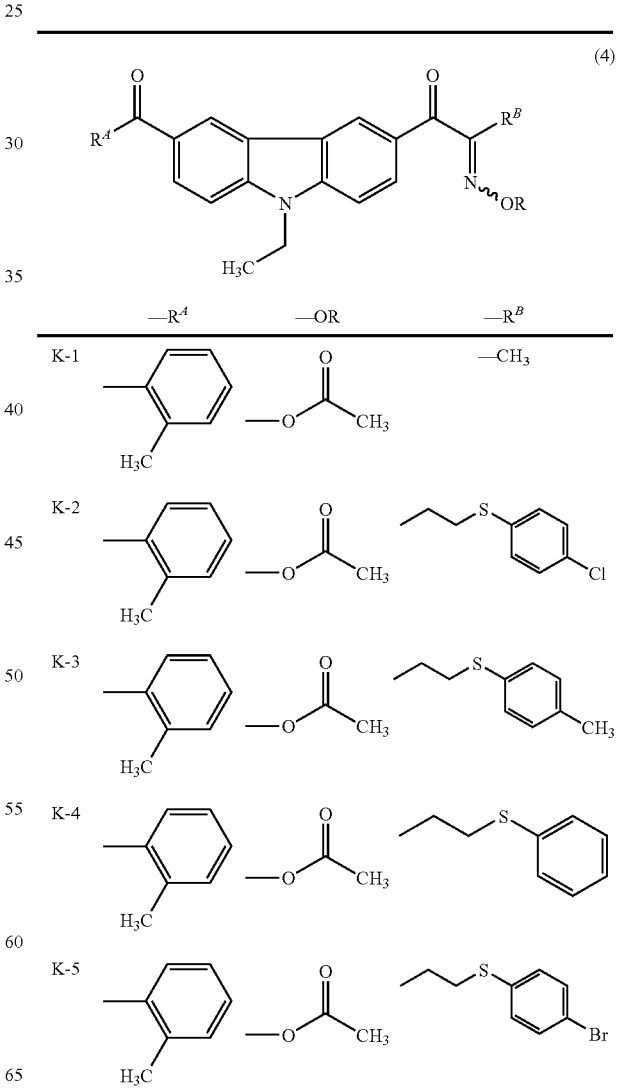

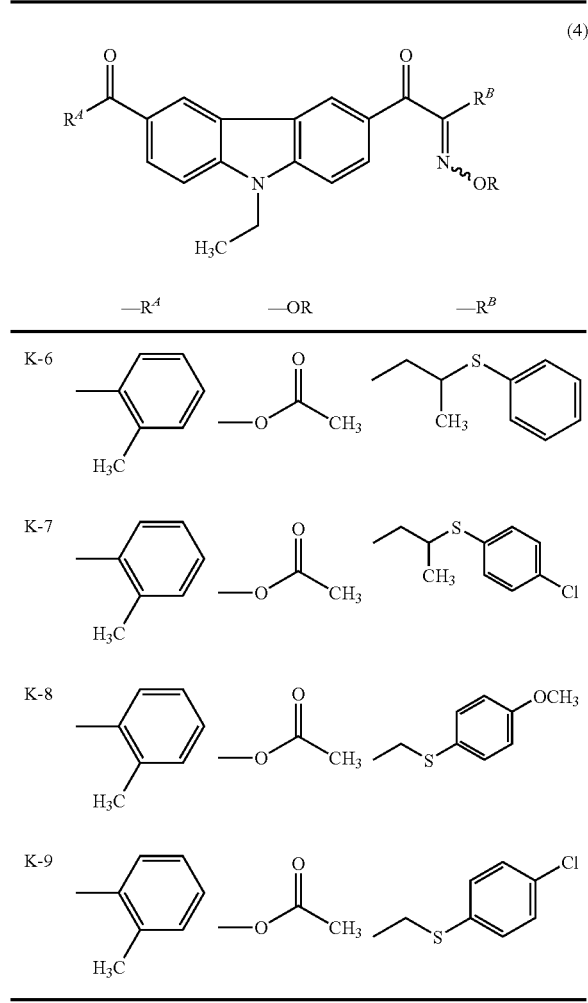
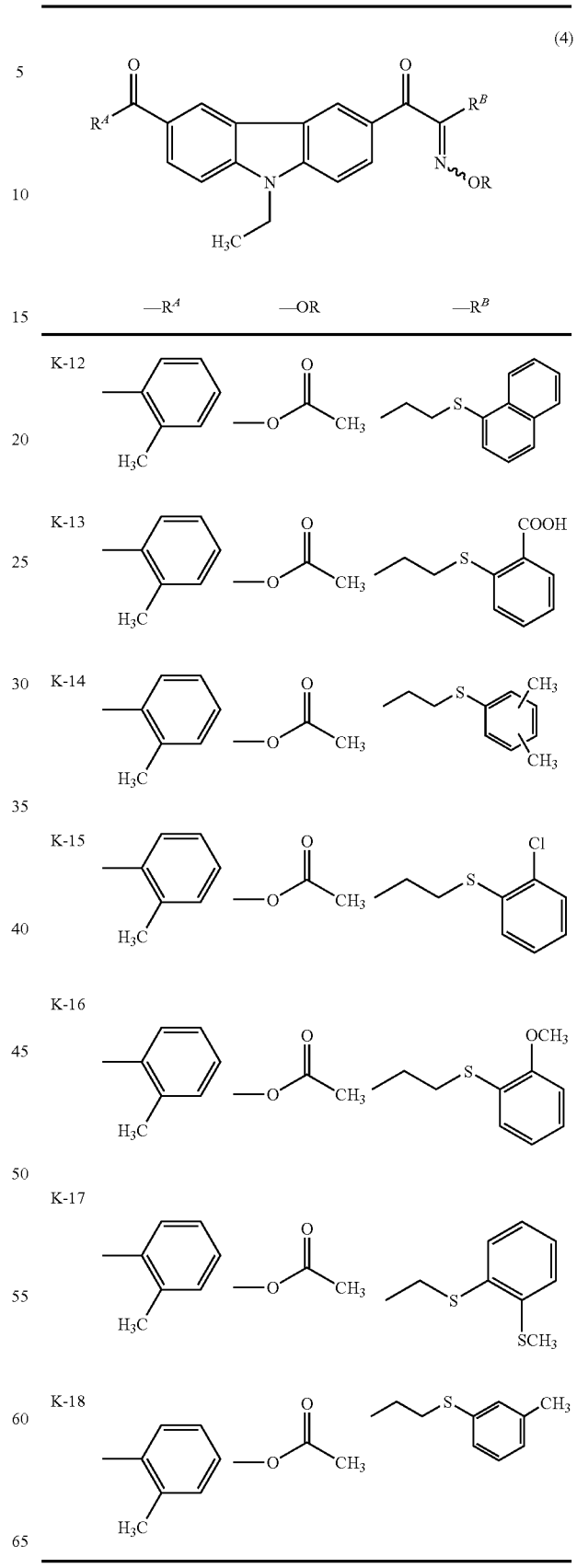

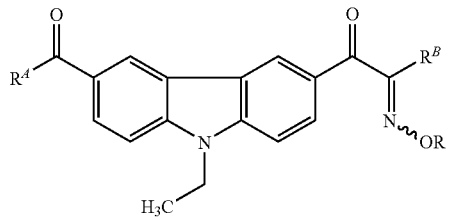
(4)
| | —R^A | —OR | —R^B |
|---|---|---|---|
| K-19 | 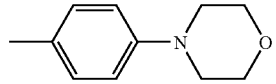 | 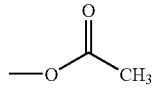 | 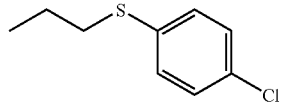 |
| K-20 | 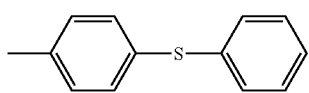 | 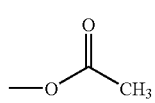 | 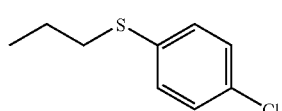 |
| K-21 | 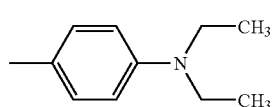 | 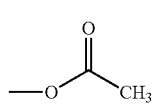 | 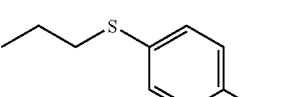 |
| K-22 | 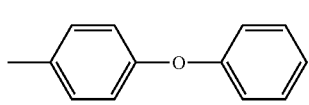 | 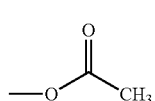 | 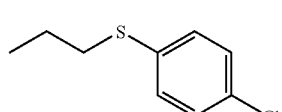 |
| K-23 | 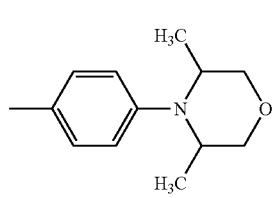 | 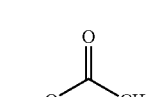 | 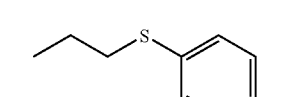 |
| K-24 | 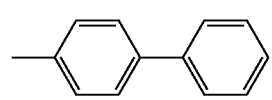 | 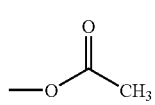 | 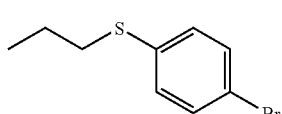 |
| K-25 | 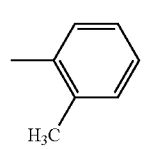 | 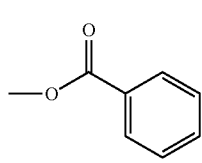 | 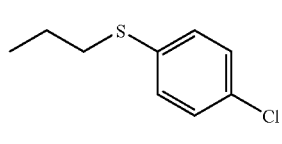 |
| K-26 | 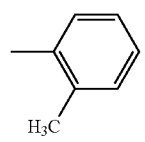 | 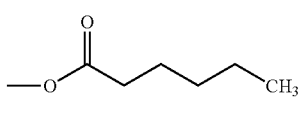 | 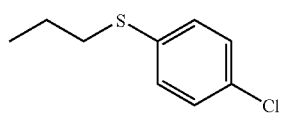 |
| K-27 | 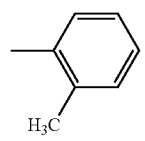 | 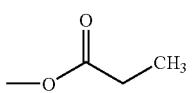 | 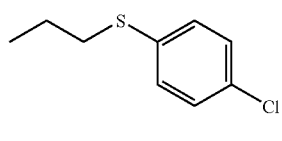 |

-continued
(4)
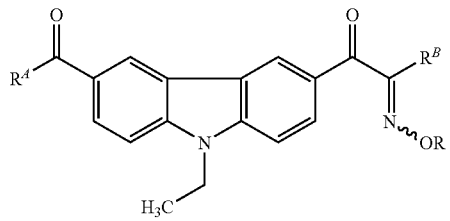
| | —R^A | —OR | —R^B |
|---|---|---|---|
| K-28 | 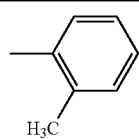 | 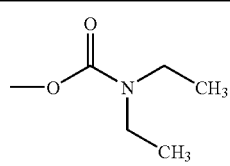 | 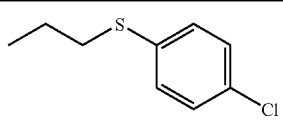 |
(4)
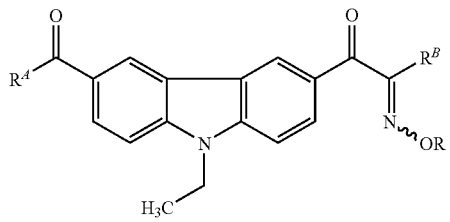
| | —R^A | —OR | —R^B |
|---|---|---|---|
| K-29 | 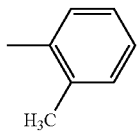 | 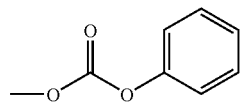 | 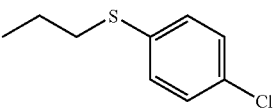 |
| K-30 | 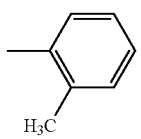 | 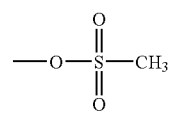 | 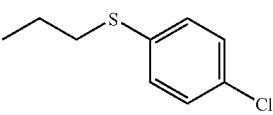 |
| K-31 | 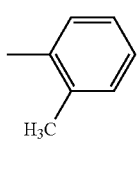 | 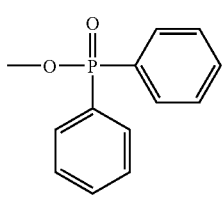 | 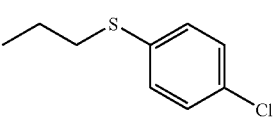 |
| K-32 | 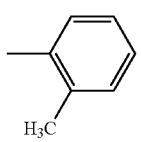 | 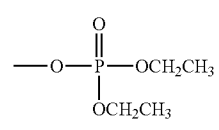 | 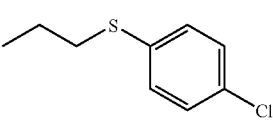 |
| K-33 | 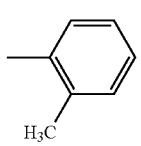 | 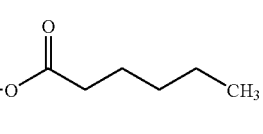 | 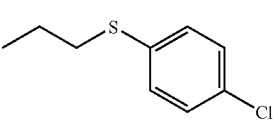 |

-continued
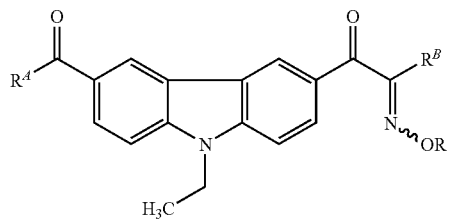
(4)
| | —$R^A$ | —OR | —$R^B$ |
|---|---|---|---|
| K-34 | 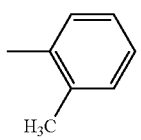 | —O—(CH2)5—CH3 | —(CH2)2—S—C6H4—Cl |
| K-35 | 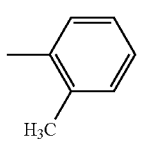 | —O—C(=O)—S—C6H5 | —(CH2)2—S—C6H4—Cl |
| K-36 | 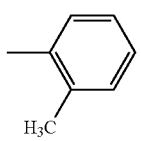 | —O—CH2—C6H5 | —(CH2)2—S—C6H4—Cl |
| K-37 | 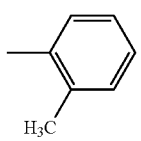 | —O—S(=O)2—CF3 | —(CH2)2—S—C6H4—Cl |
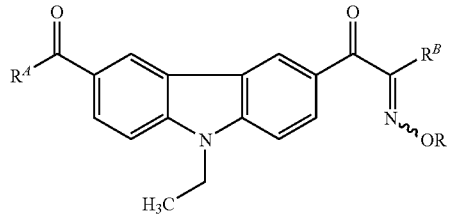
(4)
| | —$R^A$ | —OR | —$R^B$ |
|---|---|---|---|
| K-38 | 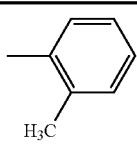 | —O—S(=O)2—C6H5 | —(CH2)2—S—C6H4—Cl |
| K-39 | 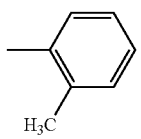 | —O—S(=O)2—CF3 | —(CH2)2—S—C6H4—Cl |

(4)
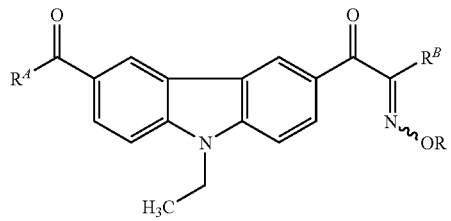
| | —R^A | —OR | —R^B |
|---|---|---|---|
| K-40 | 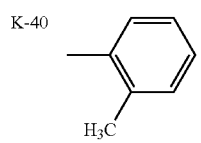 | 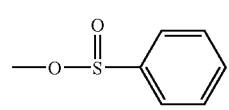 | 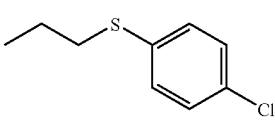 |
| K-41 | 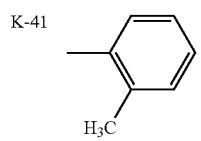 | —OCH₃ | 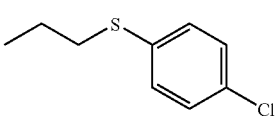 |
| K-42 | 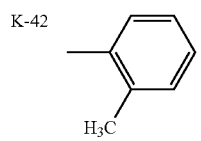 | 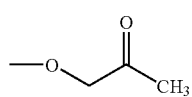 | 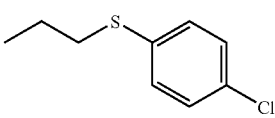 |
| K-43 | 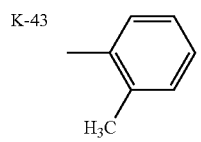 | 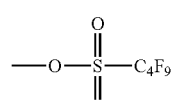 | 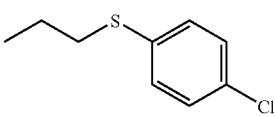 |
| K-44 | 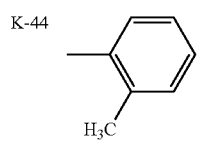 | 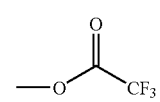 | 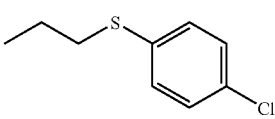 |
| K-45 | 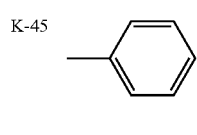 | 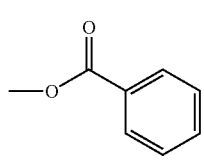 | 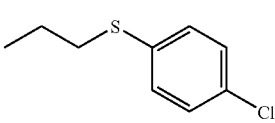 |
| K-46 | 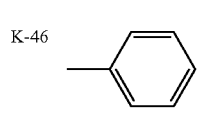 | 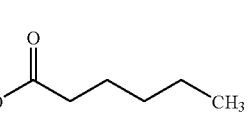 | 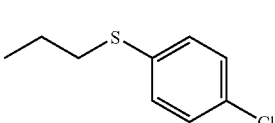 |
| K-47 | 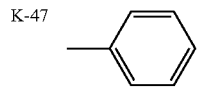 | 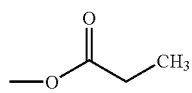 | 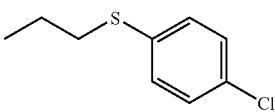 |

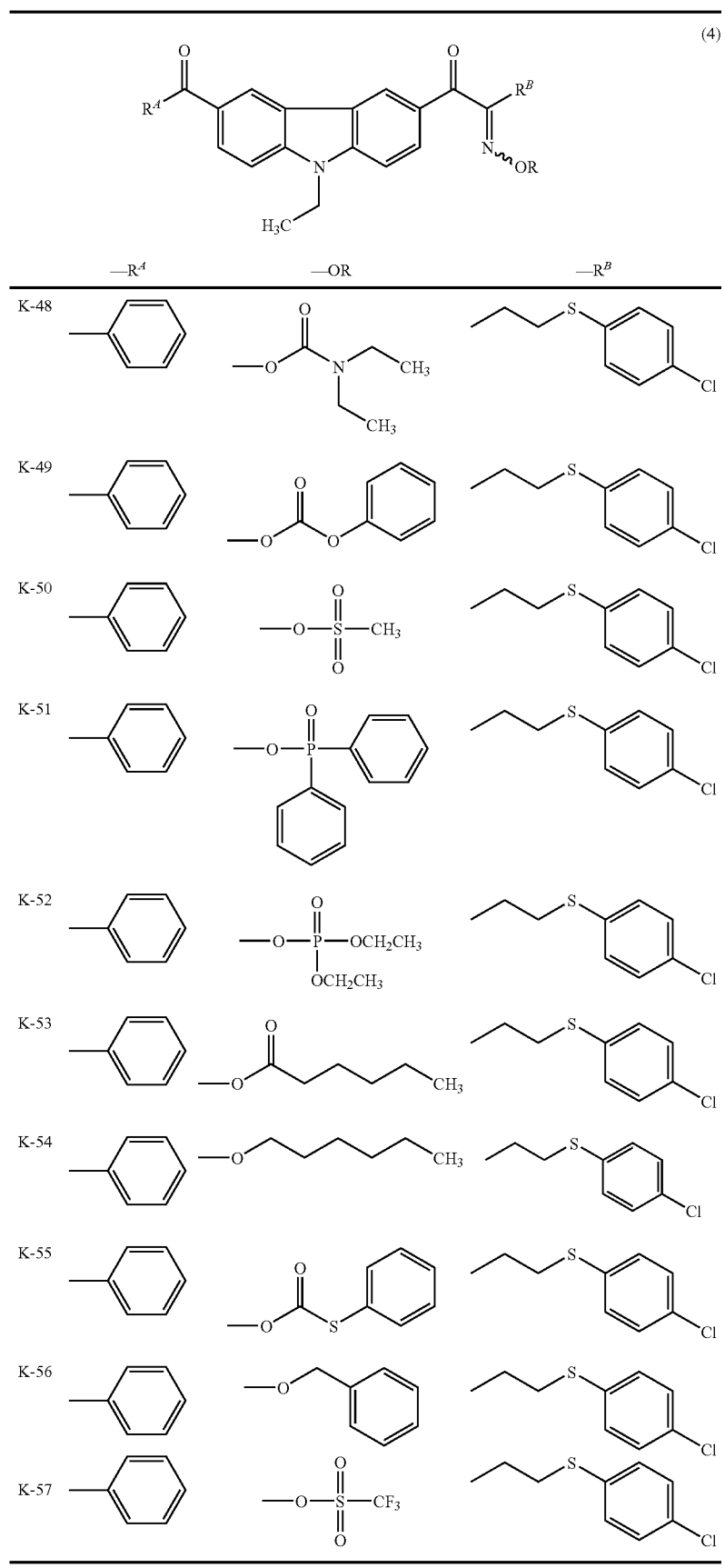

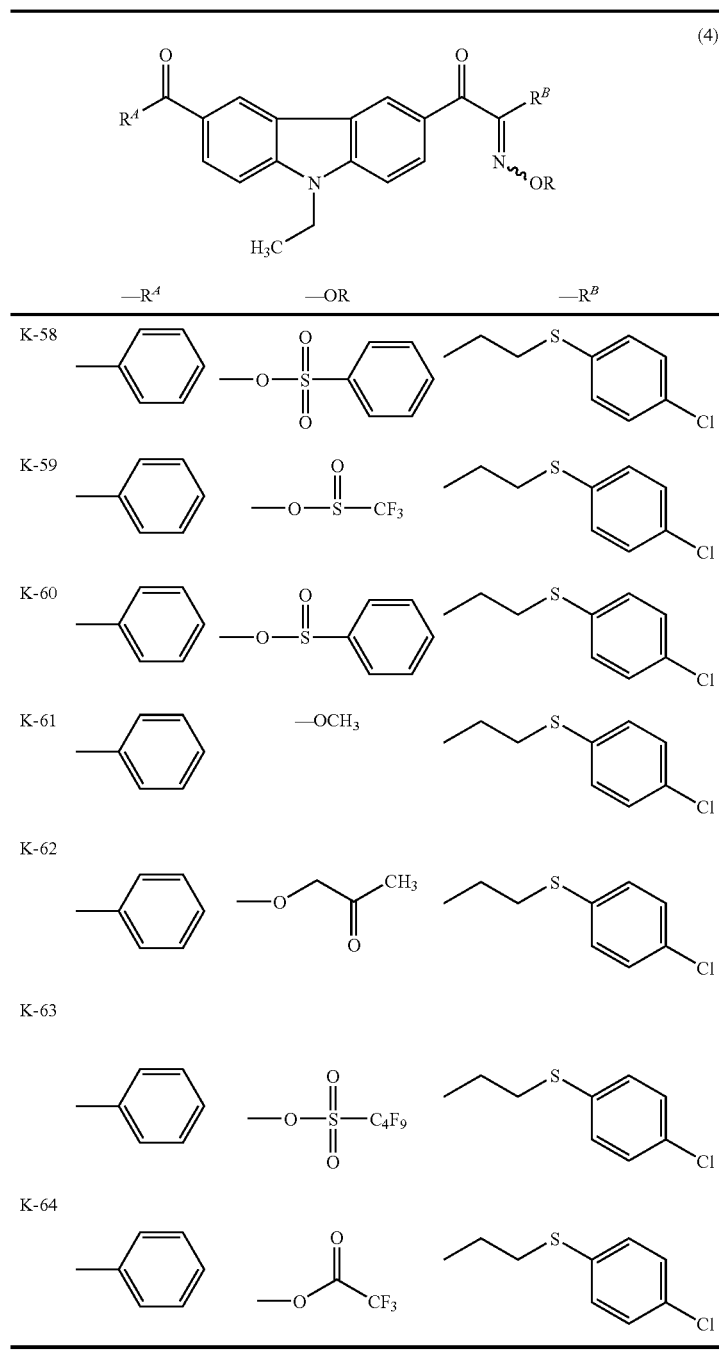
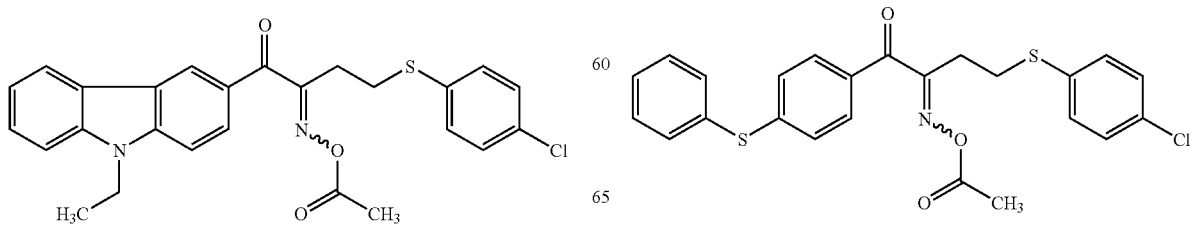

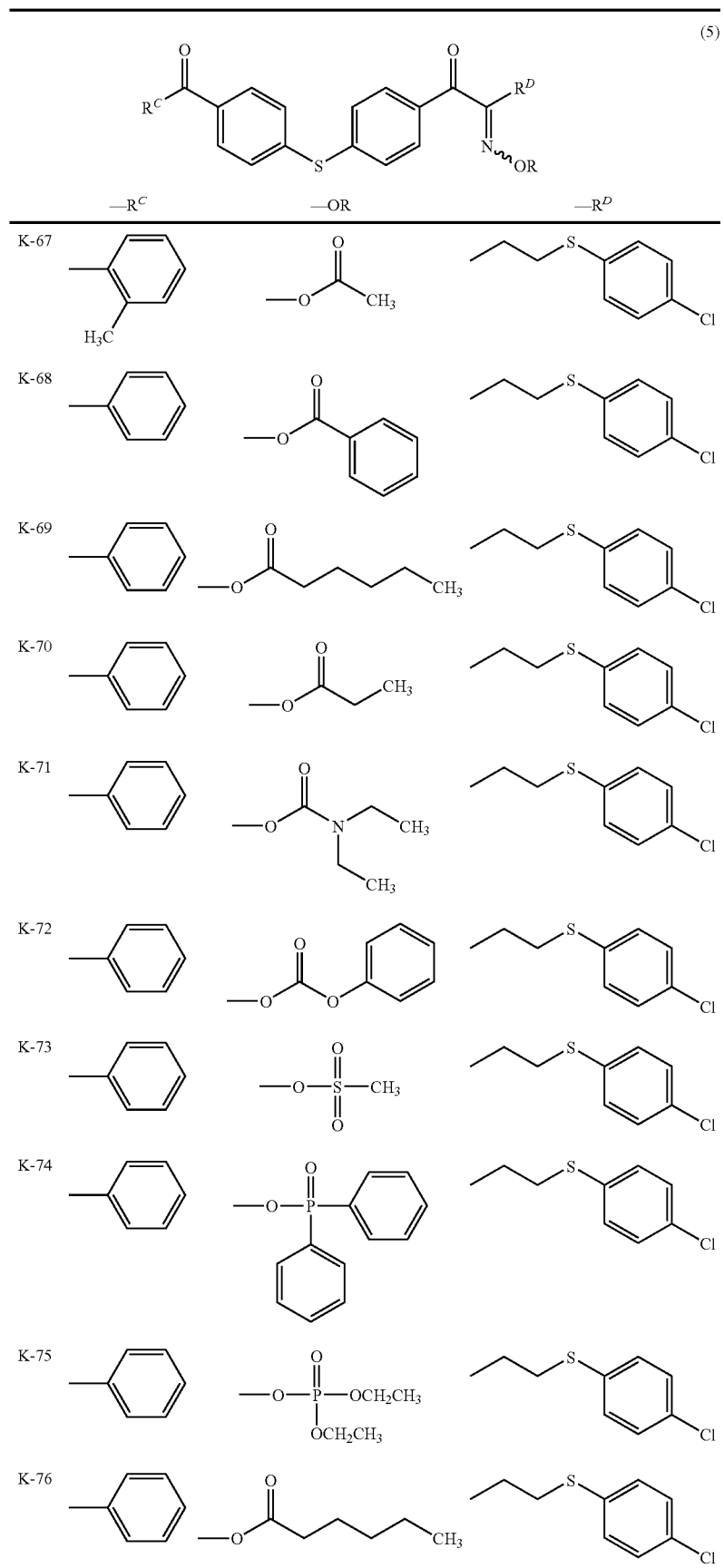

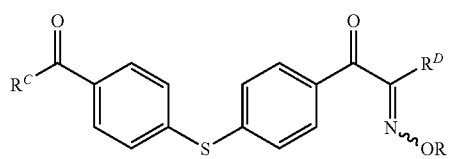
(5)
| | —R^C | —OR | —R^D |
|---|---|---|---|
| K-77 | 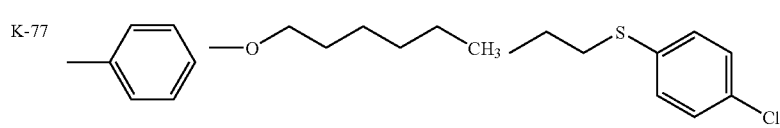 | | |
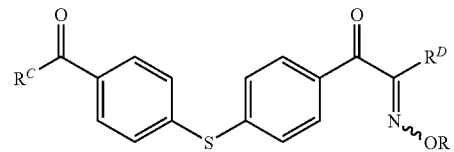
(5)
| | —R^C | —OR | —R^D |
|---|---|---|---|
| K-78 | 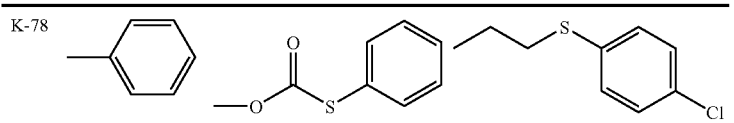 | | |
| K-79 | 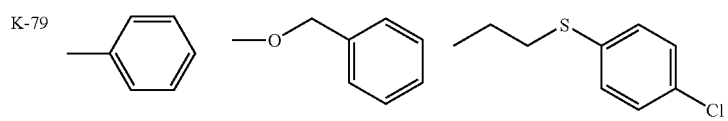 | | |
| K-80 | 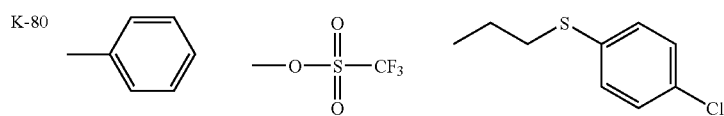 | | |
| K-81 | 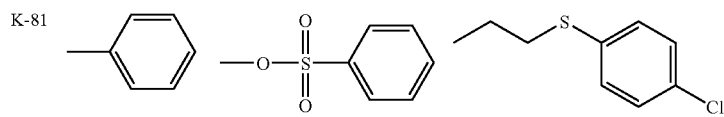 | | |
| K-82 | 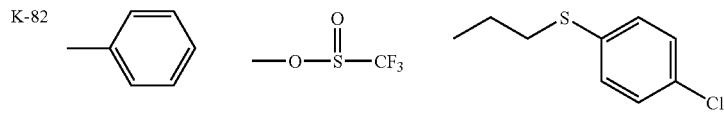 | | |
| K-83 | 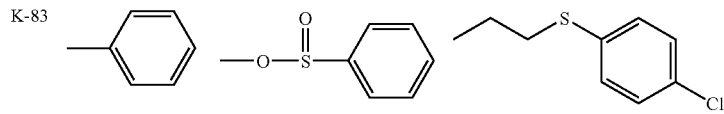 | | |
| K-84 | 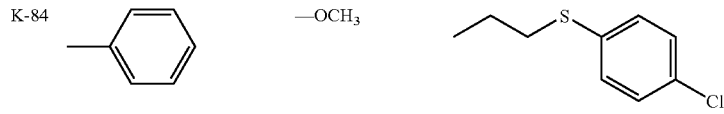 | | |

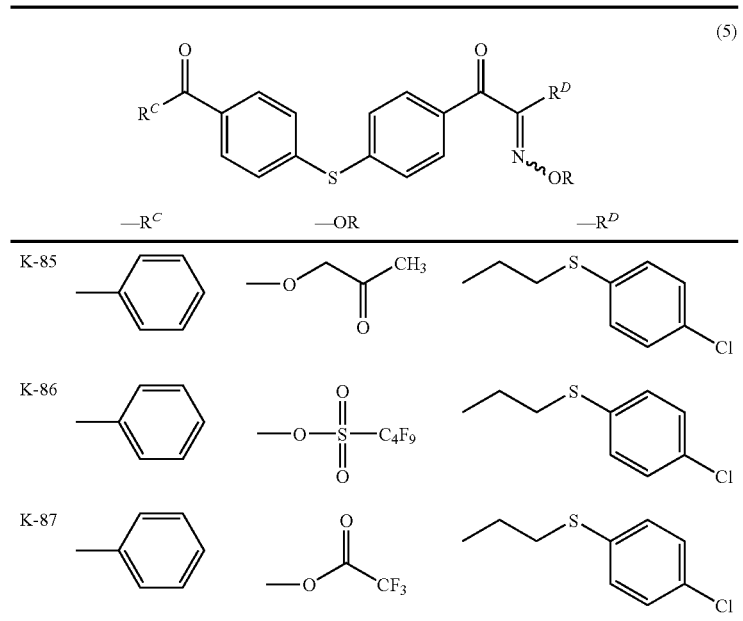

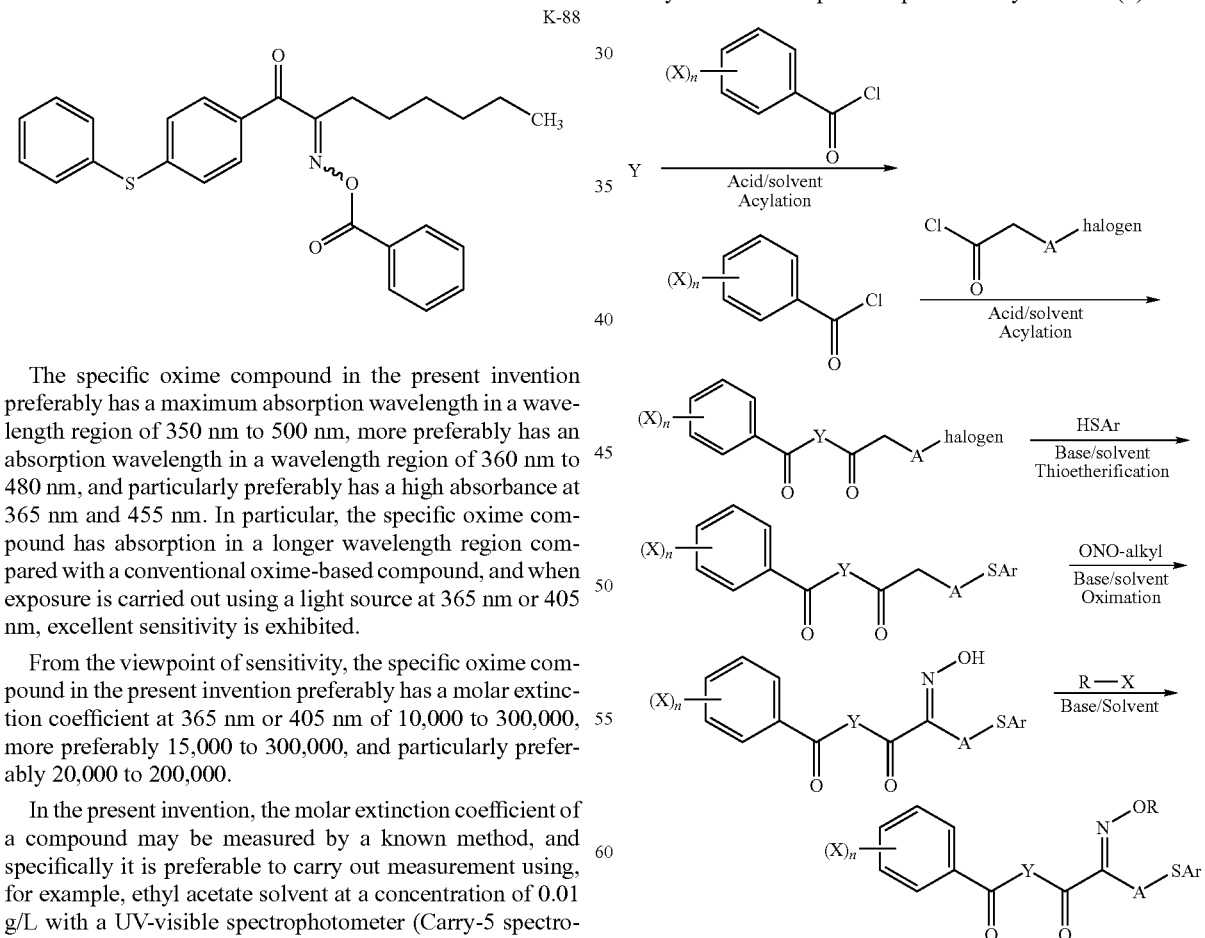

The specific oxime compound in the present invention preferably has a maximum absorption wavelength in a wavelength region of 350 nm to 500 nm, more preferably has an absorption wavelength in a wavelength region of 360 nm to 480 nm, and particularly preferably has a high absorbance at 365 nm and 455 nm. In particular, the specific oxime compound has absorption in a longer wavelength region compared with a conventional oxime-based compound, and when exposure is carried out using a light source at 365 nm or 405 nm, excellent sensitivity is exhibited.

From the viewpoint of sensitivity, the specific oxime compound in the present invention preferably has a molar extinction coefficient at 365 nm or 405 nm of 10,000 to 300,000, more preferably 15,000 to 300,000, and particularly preferably 20,000 to 200,000.

In the present invention, the molar extinction coefficient of a compound may be measured by a known method, and specifically it is preferable to carry out measurement using, for example, ethyl acetate solvent at a concentration of 0.01 g/L with a UV-visible spectrophotometer (Carry-5 spectrophotometer manufactured by Varian).

The specific oxime compound in the present invention may be synthesized by, for example, the method shown below, but it is not limited to this method.

Furthermore, the photosensitive resin composition of the present invention may employ a sensitizer or a light stabilizer in combination.

Specific examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzil, dibenzylacetone, p-(dimethylamino)phenyl styryl ketone, p-(dimethylamino)phenyl p-methylstyryl ketone, benzophenone, p-(dimethylamino) benzophenone (or Michler's ketone), p-(diethylamino)benzophenone, benzanthrone, a benzothiazole-based compound described in JP-B-51-48516, etc., Tinuvin 1130 and 400, etc.

The photosensitive resin composition of the present invention may employ another known initiator in addition to the above-mentioned photopolymerization initiator.

Specific examples thereof include a vicinal polyketaldonyl compound disclosed in U.S. Pat. No. 2,367,660, an α-carbonyl compound disclosed in U.S. Pat. Nos. 2,367,661 and 2,367,670, an acyloin ether disclosed in U.S. Pat. No. 2,448,828, an α-hydrocarbon-substituted aromatic acyloin compound disclosed in U.S. Pat. No. 2,722,512, a polynuclear quinone compound disclosed in U.S. Pat. Nos. 3,046,127 and 2,951,758, a combination of triallylimidazole dimer/p-aminophenyl ketone disclosed in U.S. Pat. No. 3,549,367, and a benzothiazole-based compound/trihalomethyl-s-triazine-based compound disclosed in JP-B-51-48516.

The photosensitive resin composition of the present invention may comprise only one type of photopolymerization initiator or two or more types thereof.

From the viewpoint of obtaining the effects of the present invention more effectively, the content (when two or more types are used, the total content) of the photopolymerization initiator in the total solids content of the photosensitive resin composition of the present invention is preferably 1 to 30 wt %, more preferably 2 to 25 wt %, and particularly preferably 3 to 20 wt %.

(E) Organic Solvent

The photosensitive resin composition of the present invention comprises an organic solvent. With regard to the organic solvent, one type may be used on its own or two or more types may be used in combination.

The organic solvent used in the present invention is not particularly limited as long as the solubility of components (A) to (D) and the coating properties of the photosensitive resin composition are satisfied, but it is particularly preferable for selection to be made while taking into consideration the dispersibility of the titanium black (A), the solubility of the resin (C), the coating properties, and safety.

Preferred examples of the solvent that can be used include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate and ethyl ethoxyacetate;

3-oxypropionic acid alkyl esters such as methyl 3-oxypropionate and ethyl 3-oxypropionate, for example, methyl 3-methoxypropionate, ethyl 3-methoxypropionate, methyl 3-ethoxypropionate, ethyl 3-ethoxypropionate, etc.; 2-oxypropionic acid alkyl esters such as methyl 2-oxypropionate, ethyl 2-oxypropionate, and propyl 2-oxypropionate, for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, etc.; methyl pyruvate, ethyl pyruvate, propyl pyruvate, methyl acetoacetate, ethyl acetoacetate, methyl 2-oxobutanoate, ethyl 2-oxobutanoate, etc.;

ethers such as diethylene glycol dimethyl ether, tetrahydrofuran, ethylene glycol monomethyl ether, ethylene glycol monoethyl ether, methyl CELLOSOLVE acetate, ethyl CELLOSOLVE acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate;

ketones such as methyl ethyl ketone, cyclohexanone, 2-heptanone, and 3-heptanone; and aromatic hydrocarbons such as toluene and xylene.

The photosensitive resin composition of the present invention may further comprise another organic solvent.

(F) Other Component

The photosensitive resin composition of the present invention may comprise (F) another component in addition to (A) to (E) above. As the other component (F), a sensitizer, a cosensitizer, a thermal polymerization inhibitor, an adhesion improving agent, and another additive can be cited as examples.

Sensitizer

The photosensitive resin composition of the present invention may comprise a sensitizer.

As the sensitizer, one that sensitizes the above-mentioned photopolymerization initiator by an electron transfer mechanism or an energy transfer mechanism is preferable.

As the sensitizer, those belonging to the compound types exemplified below and having an absorption wavelength in a wavelength region of 300 nm to 450 nm can be cited.

That is, examples thereof include polynuclear aromatic compounds (e.g. phenanthrene, anthracene, pyrene, perylene, triphenylene, 9,10-dialkoxyanthracene), xanthenes (e.g. fluorescein, eosin, erythrosine, rhodamine B, Rose Bengal), thioxanthones (isopropylthioxanthone, diethylthioxanthone, chlorothioxanthone), cyanines (e.g. thiacarbocyanine, oxacarbocyanine), merocyanines (e.g. merocyanine, carbomerocyanine), phthalocyanines, thiazines (e.g. thionine, methylene blue, toluidine blue), acridines (e.g. acridine orange, chloroflavine, acriflavine), anthraquinones (e.g. anthraquinone), squariums (e.g. squarium), coumarins (e.g. 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone, and Michler's ketone, and heterocyclic compounds such as an N-aryloxazolidinone.

When the photosensitive resin composition of the present invention comprises a sensitizer, from the viewpoint of the efficiency of light absorption in a deep part and initiation decomposition efficiency, the content of the sensitizer in the photosensitive resin composition is preferably 0.1 to 20 wt % of the weight of the total solids content, and more preferably 0.5 to 15 wt %.

Cosensitizer

The photosensitive resin composition of the present invention may comprise a cosensitizer.

The cosensitizer has a function of further improving the sensitivity of the photopolymerization initiator or the sensitizer toward actinic radiation, a function of suppressing the inhibition of polymerization of the polymerizable compound by oxygen, etc.

Examples of such a cosensitizer include amines such as compounds described in M. R. Sander et al., Journal of Polymer Society, Vol. 10, p. 3173 (1972), JP-B-44-20189, JP-A-51-82102, JP-A-52-134692, JP-A-59-138205, JP-A-60-84305, JP-A-62-18537, JP-A-64-33104, and Research Disclosure No. 33825, and specific examples thereof include triethanolamine, ethyl p-dimethylaminobenzoate, p-formyldimethylaniline, and p-methylthiodimethylaniline.

Further examples of the cosensitizer include thiols and sulfides such as thiol compounds described in JP-A-53-702, JP-B-55-500806, and JP-A-5-142772, and disulfide compounds described in JP-A-56-75643, and specific examples thereof include 2-mercaptobenzothiazole, 2-mercaptobenzoxazole, 2-mercaptobenzimidazole, 2-mercapto-4(3H)-quinazoline, and β-mercaptonaphthalene.

Furthermore, other examples of the cosensitizer include amino acid compounds (e.g. N-phenylglycine, etc.), organometallic compounds (e.g. tributyltin acetate, etc.) described in JP-B-48-42965, hydrogen donors described in JP-B-55-34414, and sulfur compounds (e.g. trithiane, etc.) described in JP-A-6-308727.

When the photosensitive resin composition of the present invention comprises a cosensitizer, from the viewpoint of improving the cure rate by means of the balance of polymer growth rate and chain transfer, the content of the cosensitizer is preferably in the range of 0.1 to 30 wt % relative to the weight of the total solids content of the photosensitive resin composition, more preferably in the range of 1 to 25 wt %, and yet more preferably in the range of 0.5 to 20 wt %.

Thermal Polymerization Inhibitor

In the photosensitive resin composition of the present invention, a small amount of thermal polymerization inhibitor may be added in order to prevent unnecessary thermal polymerization of the polymerizable compound during production or storage of the composition.

As the thermal polymerization inhibitor that can be used in the present invention, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium (III) salt, etc. can be cited.

When the photosensitive resin composition of the present invention comprises a thermal polymerization inhibitor, the amount of thermal polymerization inhibitor added is preferably about 0.01 to about 5 wt % relative to the total solids content of the photosensitive resin composition.

Furthermore, in order to prevent inhibition of polymerization by oxygen, a higher fatty acid derivative such as behenic acid or behenamide, etc. may be added as necessary, the higher fatty acid derivative being localized on the surface of a coating during drying after coating. The amount of higher fatty acid derivative added is preferably about 0.5 to about 10 wt % of the total composition.

Adhesion Improving Agent

In the photosensitive resin composition of the present invention, in order to improve adhesion to a hard surface such as a substrate, an adhesion improving agent may be added. As the adhesion improving agent, a silane-based coupling agent, a titanium coupling agent, etc. can be cited.

Examples of the silane-based coupling agent include γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatopropyltrimethoxysilane, γ-isocyanatopropyltriethoxysilane, N-β-(N-vinylbenzylaminoethyl)-γ-aminopropyltrimethoxysilane hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, and (acryloxymethyl)methyldimethoxysilane.

Among them, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane are preferable, and γ-methacryloxypropyltrimethoxysilane is most preferable.

When the photosensitive resin composition of the present invention comprises an adhesion improving agent, the amount of adhesion improving agent added is preferably 0.5 to 30 wt % of the total solids content of the photosensitive resin composition, and more preferably 0.7 to 20 wt %.

Other Additive

Furthermore, a known additive such as an inorganic filler, a plasticizer, or an oleophilizing agent may be added to the photosensitive resin composition of the present invention in order to improve the physical properties of a cured film.

Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetyl glycerol, and it may be added at no greater than 10 wt % of the total solids content (nonvolatile components).

Process for Producing Photosensitive Resin Composition

The photosensitive resin composition of the present invention may be prepared by mixing (A) to (E) above and as necessary (F) and other components, and dispersing the titanium black uniformly.

The titanium black is preferably dispersed in advance in a resin solution in the presence of a dispersion adjuvant. A step of dispersing titanium black preferably comprises two stages, that is, a step of kneading in a high viscosity resin solution and subsequently a dispersion step of carrying out medium-dispersion using a medium.

In the step of kneading the titanium black in the production of the photosensitive resin composition of the present invention, the titanium black and another black color material used in combination, a dispersant and/or a surface-treatment agent, an alkali-soluble resin, and a solvent are firstly kneaded. A machine used for kneading is not particularly limited;

examples thereof include a two roll mill, a three roll mill, a ball mill, a Tron Mill, a disper, a kneader, a co-kneader, a homogenizer, a blender, and a single screw or double screw extruder, and dispersion is preferably carried out while applying a strong shear force.

Subsequently, an organic solvent and a resin (the remaining resin from the kneading step) are added. Examples of machines used in the dispersion step mainly include a vertical or horizontal sand grinder, a pin mill, a slit mill, and an ultrasonic dispersing machine, and dispersion is preferably carried out using a medium (beads) such as glass or zirconia having a particle size of 0.1 to 1 mm.

The above-mentioned kneading step may be omitted, and in this case medium dispersion of a pigment, a dispersant and/or a surface-treatment agent, a resin, and a solvent is preferably carried out. In this case, the remaining resin from the kneading step is preferably added partway through the dispersion.

Details of the kneading step and the dispersion step are described in T. C. Patton, 'Paint Flow and Pigment Dispersion' (1964, John Wiley and Sons), etc.

(2) Light-Shielding Color Filter

The photosensitive resin composition of the present invention is preferably used in production of a light-shielding color filter.

The 'light-shielding color filter' referred to in the present invention means a light-shielding pattern obtained by providing a coating of a photosensitive resin composition comprising at least a black color material, a photopolymerizable compound, a resin, a photopolymerization initiator, and two or more types of organic solvents, exposing, and developing. The color of the 'light-shielding color filter' in the present invention may be an achromatic color such as black or gray, or black, gray, etc. having a chromatic color mixed therewith.

Since the 'light-shielding color filter' is obtained by providing a coating of a photosensitive resin composition comprising at least a black color material, a photopolymerizable compound, a resin, a photopolymerization initiator, and an organic solvent, exposing, and developing, it may be interchangeably called a light-shielding film or a light-shielding filter.

The light-shielding color filter preferably has an average transmittance of no greater than 10% in the visible region and the IR region (400 to 1,600 nm), and more preferably no greater than 1%.

The light-shielding color filter is preferably provided in a light-shielding section on the periphery of an image pickup section of an image sensor and/or a light-shielding section on a reverse face opposite to the surface with the image pickup section.

By enhancing the light-shielding properties of the light-shielding section on the periphery of the image pickup section and/or the reverse face of the image pickup face, it is possible to reduce dark current generated in an area other than the image pickup section, and improve the photoelectric conversion function in passing through the color filter disposed on the image sensor.

Furthermore, in the present invention, the optical density of a light-shielding color filter formed using the photosensitive resin composition is preferably at least 2 but no greater than 10, more preferably at least 3 but no greater than 10, and particularly preferably at least 4 but no greater than 9.

The film thickness of the light-shielding color filter is not particularly limited, but from the viewpoint of obtaining the effects of the present invention more effectively, it is preferably 0.1 µm to 10 µm, more preferably 0.3 µm to 5.0 µm, and particularly preferably 0.5 µm to 3.0 µm.

The size (length of one side) of the light-shielding color filter is not particularly limited, but from the viewpoint of obtaining the effects of the present invention more effectively, it is preferably at least 200 µm, more preferably at least 500 µm, and particularly preferably at least 1,000 µm. The upper limit thereof is not particularly limited, but is preferably 10,000 µm.

Furthermore, the area of the light-shielding color filter is not particularly limited, but from the viewpoint of obtaining the effects of the present invention more effectively, it is preferably at least 0.05 $mm^2$, more preferably at least 0.2 $mm^2$, and particularly preferably at least 1 $mm^2$. The upper limit thereof is not particularly limited, but is preferably no greater than 9 $mm^2$.

The light-shielding color filter of the present invention may suitably be used in an image sensor such as a CCD or a CMOS, and it is particularly suitable for an image sensor such as a CCD or a CMOS having greater than 1,000,000 pixels.

(3) Process for Producing Light-Shielding Color Filter

A process for producing the light-shielding color filter of the present invention is not particularly limited, and preferably comprises (a) a step of coating a substrate with the photosensitive resin composition of the present invention (photosensitive layer formation step), (b) a step of imagewise exposing (exposure step), and (c) a step of developing to form a pattern (development step).

Each step of the process for producing the light-shielding color filter of the present invention is explained below.

(a) Photosensitive Layer Formation Step

In the photosensitive layer formation step, a photosensitive layer is formed by coating the top of a substrate with the photosensitive resin composition of the present invention.

Examples of a substrate that can be used in this step include a photoelectric transducer substrate such as a silicon substrate used in an image sensor, etc., and a complementary metal oxide semiconductor (CMOS).

Furthermore, an undercoat layer may be provided on the top of these substrates as necessary in order to improve adhesion to an upper layer, prevent diffusion of a material, or planarize the surface of the substrate.

As a method for coating the top of a substrate with the photosensitive resin composition of the present invention, various types of coating methods such as slit coating, an inkjet method, spin coating, cast coating, roll coating, and a screen printing method may be employed.

With regard to the coating thickness of the photosensitive resin composition, from the viewpoint of resolution and developability it is preferably 0.35 µm to 3.0 µm, and more preferably 0.50 µm to 2.5 µm.

The photosensitive resin composition applied onto the substrate is usually dried under conditions of 70° C. to 110° C. for on the order of 2 min to 4 min, thus forming a photosensitive layer.

(b) Exposure Step

In the exposure step, the photosensitive layer formed in the photosensitive layer formation step is exposed and cured. In the present invention, the exposure step is preferably a step in which exposure is carried out through a mask, and more preferably is a step in which exposure is carried out through a photomask. When exposure is carried out through a mask, it is preferable to cure only a coating portion that is irradiated with light.

Exposure is preferably carried out by irradiation with radiation; as radiation that can be used when carrying out exposure, in particular, UV rays such as g rays (436 nm) and i rays (365 nm) are preferably used, i rays are more preferably used, and as a light source thereof, a high pressure mercury lamp is preferable. The irradiation intensity is preferably 5 mJ to 1,500 mJ, more preferably 10 mJ to 1,000 mJ, and most preferably 10 mJ to 800 mJ.

(c) Development Step

Subsequent to the exposure step, an alkali development treatment (development step) may be carried out.

In the development step, a portion that has not been exposed in the exposure step is leached in an alkaline aqueous solution. This leaves only a portion that has been photocured.

As a developer, an organic alkali developer that does not cause any damage to a circuit, etc. on a base is desirable. The development temperature is usually 20° C. to 30° C., and the development time is 20 to 90 sec.

As the alkali used in the developer, an alkaline aqueous solution in which an organic alkaline compound such as aqueous ammonia, ethylamine, diethylamine, dimethylethanolamine, tetramethylammonium hydroxide, tetraethylammonium hydroxide, choline, pyrrole, piperidine, or 1,8-diazabicyclo[5,4,0]-7-undecene is diluted with pure water so as to give a concentration of 0.001 to 10 wt % and preferably 0.01 to 1 wt % is used. When a developer comprising such an alkaline aqueous solution is used, washing (rinsing) with pure water is generally carried out after developing.

In the process for producing a light-shielding filter for the image sensor of the present invention, after the above-mentioned photosensitive layer-formation step, exposure step, and development step are carried out, a curing step of curing by heating and/or exposing the pattern formed may be carried out as necessary.

A heating step (post bake treatment) subsequent to the development step is heating after development in order to complete curing, and it is preferable to carry out heating at 180° C. to 250° C. (hard bake). This post bake treatment may be carried out for the coating liquid after development continuously or batchwise using heating means such as a hot plate, a convection oven (hot air circulation type dryer), or a high frequency heater under the above-mentioned temperature conditions.

Furthermore, in combination with or independently from the above-mentioned post bake treatment, irradiation with UV rays may be carried out using a high pressure mercury lamp, etc., thus curing a colored pattern (post cure treatment).

(4) Image Sensor

The photosensitive resin composition of the present invention may preferably be used for an image sensor. Specifically, after the photosensitive resin composition of the present invention is provided by coating over a substrate as a thin film, a light-shielding color filter having a desired shape may be produced by imagewise exposure by means of i rays, etc. and development to form a pattern.

As hereinbefore described, the light-shielding color filter means a light-shielding pattern obtained by exposing and developing a photosensitive resin composition comprising at least a black color material, a photopolymerizable compound, a resin, a photopolymerization initiator, and a solvent. The color of the 'light-shielding color filter' in the present invention may be an achromatic color such as black or gray, or black, gray, etc. having a chromatic color mixed therewith. Furthermore, the filter preferably has an average transmittance of no greater than 10% in the visible region and the IR region (400 to 1,600 nm), and more preferably no greater than 1%.

The image sensor of the present invention comprises the above-mentioned light-shielding color filter.

The image sensor is explained below by reference to drawings.

FIG. 1 is a sectional view showing one example of an image pickup section and a light-shielding section disposed on the periphery in the image sensor of the present invention. FIG. 1 illustrates one example of the image sensor having a light-shielding color filter formed by photocuring the solids content of the photosensitive resin composition of the present invention on the periphery of a color filter made up of three primary color pixels.

In FIG. 1, an image sensor 1 has a photoelectric transducer (light-receiving sensor section) 12 on a silicon substrate 10. Furthermore, transfer electrodes (14a, 14b) for transferring generated charge are provided adjacent to the photoelectric transducer 12. These transfer electrodes 14a and 14b are covered with an insulating film 16.

Color filters (4R, 4G, 4B) in which three primary color pixels comprising three primary colors of R (red), G (green), and B (blue) are regularly arranged are disposed on the photoelectric transducer 12, thus forming an image pickup section 2. A light-shielding section 3 comprising a light-shielding color filter 5 formed by photocuring the photosensitive resin composition of the present invention is formed on the periphery of the image pickup section 2.

In FIG. 1, the CCD or CMOS etc. photoelectric transducer 12, transfer electrodes 14a and 14b, planarization layer 18a, etc. necessary as the image sensor 1 may be formed in accordance with a known IC production process. The color filters (4R, 4G, 4B) and the light-shielding color filter 5 may be formed by a photoresist technique. A planarization layer 18b may also be formed on the color filters (4R, 4G, 4B). It is preferable to provide a microlens 17 over the color filters (4R, 4G, 4B) for the purpose of focusing.

A photosensitive resin composition comprising titanium black as a light-shielding agent for visible light and IR light is applied uniformly over the silicon substrate 10 with the color filters (4R, 4G, 4B) formed thereon and is heated, thus forming a dry coating. Subsequently, a pattern of the light-shielding color filter 5 may be obtained by exposing this dry coating using a commercial i ray stepper, etc. via a mask with a mask pattern formed thereon so as to open the image pickup section 2 and cover a photoelectric transducer, etc. used for measuring dark current, followed by alkali development, rinsing with water, and drying.

After the planarization layer 18b and the microlens 17 are formed as necessary on the substrate thus obtained, dicing and packaging are carried out, thus giving the image sensor 1.

In this process, the film thickness of an optically functional layer from the surface of the silicon substrate to the lower surface of the microlens is preferably no greater than 5 µm, more preferably no greater than 4.5 µm, and particularly preferably no greater than 4 µm.

In the image sensor of the present invention, as described above, it is preferable to dispose a light-shielding color filter on the periphery of the image pickup section on the front face side as well as to dispose a light-shielding color filter on the reverse face opposite to the face where the image pickup section is present.

More particularly, in an image sensor having on the reverse face of the image sensor a plurality of protruding electrodes for connecting to a wiring board, it is preferable for it to comprise a light-shielding color filter on the reverse face in a region other than the protruding electrodes.

Conventionally, in an image sensor having protruding electrodes on the reverse face, stray light enters the interior of the image sensor between the image sensor and the image sensor wiring board, thus generating dark current, and a picked-up image tends to deteriorate. Since the image sensor of the present invention can comprise a light-shielding color filter on the reverse face, it is possible to prevent stray light from entering. Therefore, even if injection, etc. of a light-shielding underfill resin for preventing stray light from entering, which is conventionally carried out, is omitted, it is possible to suppress generation of dark current due to stray light from the reverse face side, and improve color reproduction.

Figure 2:
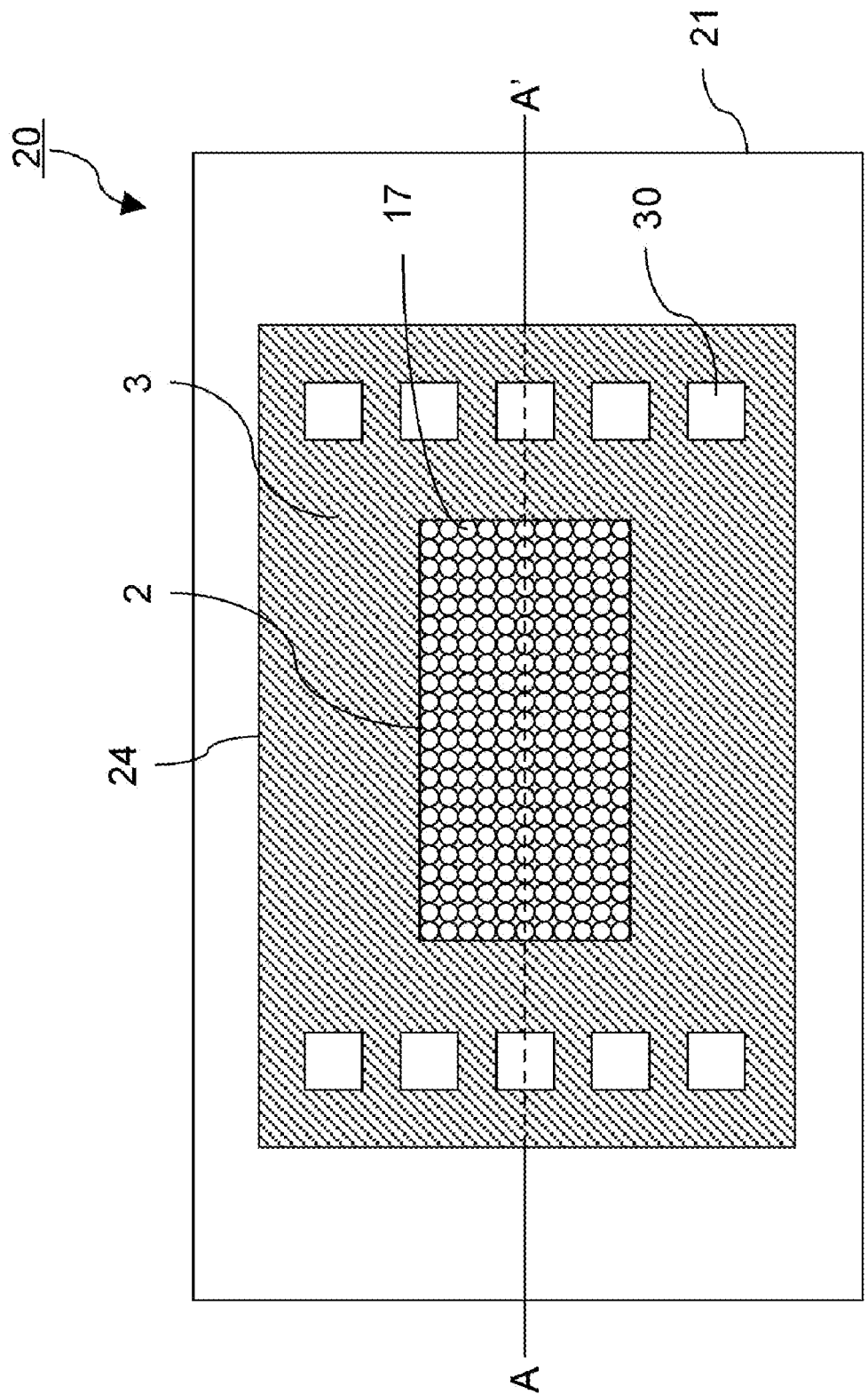
FIG. 2 A schematic plan view showing one example of a solid-state image pickup device comprising the image sensor of the present invention.
Figure 3:
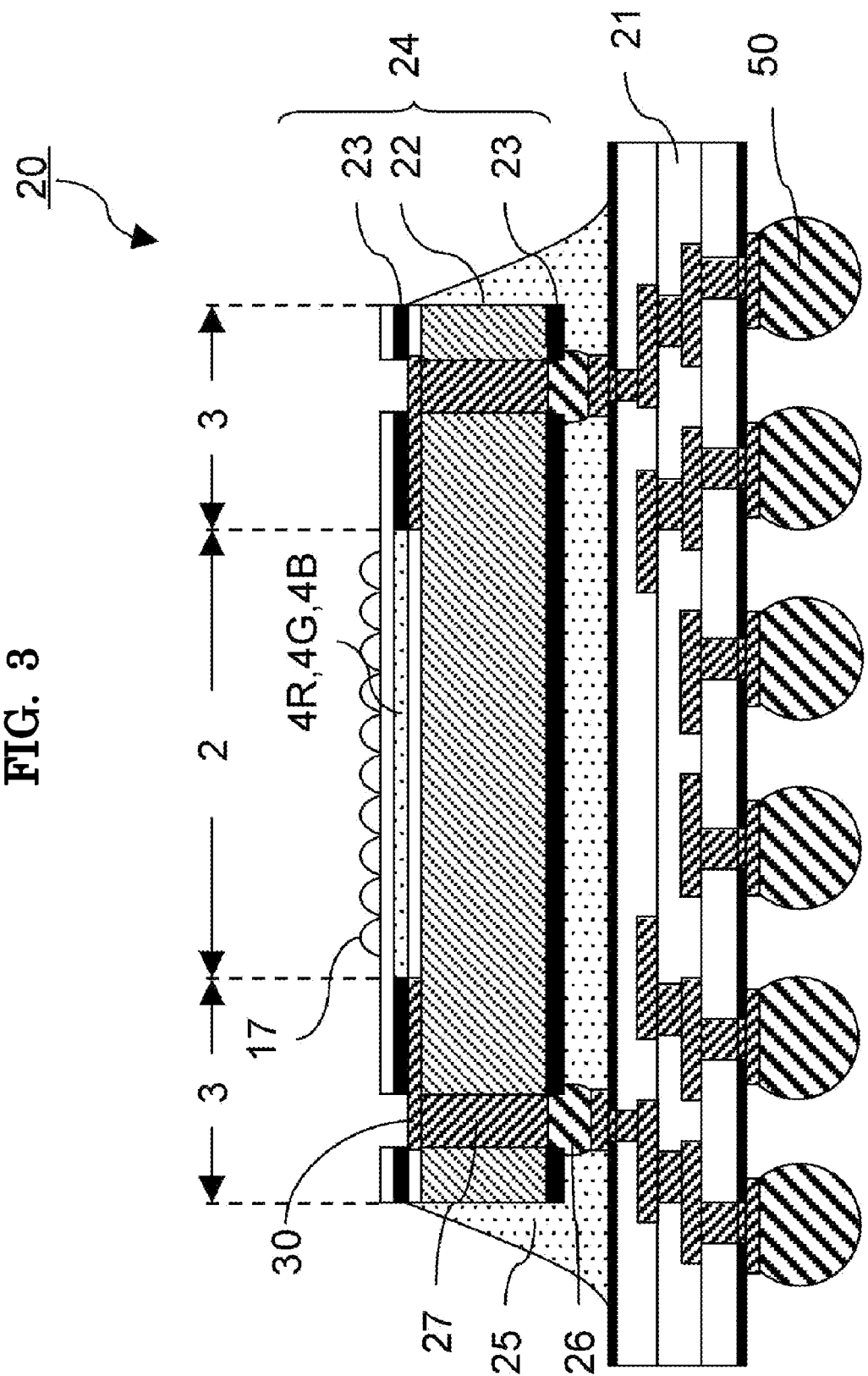
FIG. 3 A sectional view of one example of a solid-state image pickup device comprising the image sensor of the present invention.

Referring to FIG. 2 and FIG. 3, a preferred embodiment of the image sensor of the present invention is explained. FIG. 2 is a schematic diagram showing one example of the image sensor of the present invention. FIG. 3 is a sectional view along A-A' in FIG. 2.

As shown in FIG. 2, an image sensor solid-state image pickup device 20 comprises an image sensor 24 comprising an image pickup section 2, a light-shielding section 3, and a bonding pad 30.

FIG. 3 is a sectional view of the solid-state image pickup device 20 comprising the image sensor 24 shown in FIG. 2 and its wiring board 21. The image sensor 24 comprises the image pickup section 2 and the light-shielding section 3 on the surface, and comprises a light-shielding color filter 23 and a protruding electrode 26 on the reverse face. Furthermore, it may comprise an underfill resin 25 between the image sensor 24 and the wiring board 21 for the purpose of improving durability and preventing stray light.

A through electrode 27 is formed underneath the bonding pad 30 formed on the image sensor 24, and is connected to the protruding electrode 26 provided on the reverse face of the image sensor 24.

The image sensor 24 may be connected to the wiring board 21 via the protruding electrode 26, a plurality of which may be formed. The protruding electrode 26 is not limited, and a known electrode may be used, examples thereof including a solder ball, a gold stud bump, and a gold plated bump.

When the light-shielding color filter 23 is disposed on the reverse face of the image sensor 24 of the present invention, dark current, which is generated by picked-up light entering the image sensor as stray light, can be suppressed.

In accordance with the present invention, there can be provided a photosensitive resin composition that can form a light-shielding color filter having good adhesion to a substrate and having excellent coating thickness uniformity. Moreover, in accordance with the present invention, there can be provided a light-shielding color filter formed using the photosensitive resin composition and a production process therefore, and an image sensor.

EXAMPLES

The present invention is explained more specifically below by reference to Examples, but the present invention is not limited by the Examples below. 'Parts' and 'percentage (%)' are on a weight basis unless otherwise specified.

(1) Preparation of Titanium Black Dispersion

Preparation of Coarse Titanium Black Dispersion

A coarse dispersion of titanium black was prepared by subjecting the composition below to a high viscosity dispersion treatment using a two roll mill. The coarse dispersion thus obtained had a viscosity of 40,000 mPa·s.

Kneading may be carried out by a kneader for 30 minutes prior to the high viscosity dispersion treatment.

Composition of Coarse Titanium Black Dispersion

Titanium black 13M-T, manufactured by Jemco Inc.: 40 parts
Propylene glycol monomethyl ether acetate solution of benzyl methacrylate/methacrylic acid copolymer (BzMA/MM=70/30 (molar ratio), Mw: 30,000, solids content 40 wt %): 6 parts
Solsperse 5000 (manufactured by Zeneca): 1 part Component (A) below was added to the coarse titanium black dispersion thus obtained, and stirring was carried out for 3 hours by a homogenizer under conditions of 3,000 rpm. The solution mixture thus obtained was subjected to a dispersion treatment by a disperser (Dispermat, manufactured by Getzmann) employing 0.3 mm zirconia beads for 4 hours, thus giving a titanium black dispersion. The viscosity of this dispersion was 8.0 mPa·s.

Component (A)

Propylene glycol monomethyl ether acetate solution of benzyl methacrylate/methacrylic acid copolymer (BzMA/MAA=70/30 (molar ratio), Mw: 30,000, solids content 40 wt %): 10 parts
Organic solvent (propylene glycol monomethyl ether acetate): 140 parts Example 1

(2) Preparation of Photosensitive Resin Composition

A photosensitive resin composition was prepared by mixing the components below.
Methyl methacrylate/methacrylic acid three-component copolymer ((J-1) below): 6.1 parts
Dipentaerythritol hexaacrylate (T-1): 4.8 parts
Ethoxylated pentaerythritol tetraacrylate (T-2): 1.7 parts
Titanium black dispersion above: 67 parts
Propylene glycol monomethyl ether acetate (PGMEA): 15.7 parts
Oxime-based photopolymerization initiator (K-1): 1.7 parts

J-1

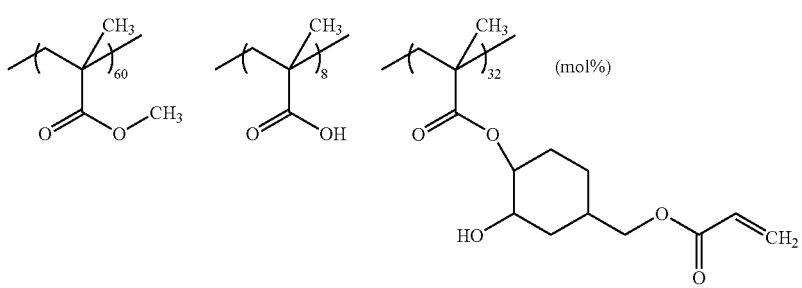

T-1
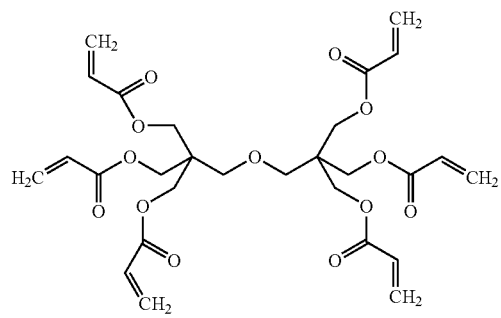
T-2
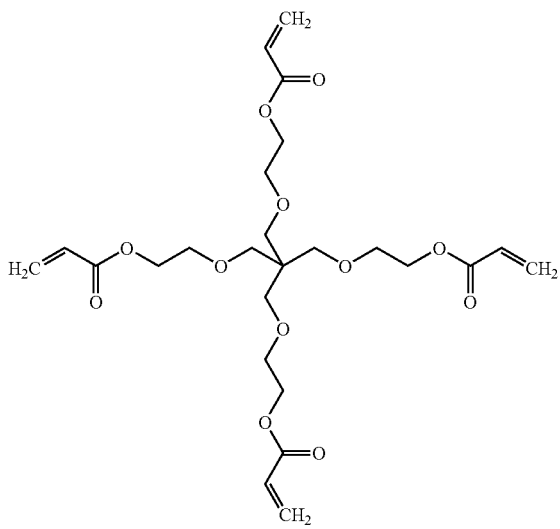
T-3
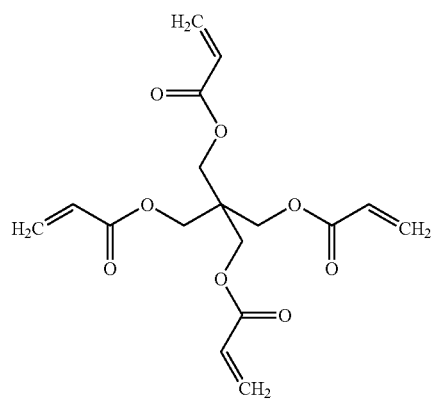
T-4
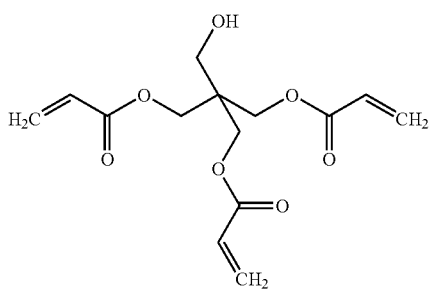
K-1
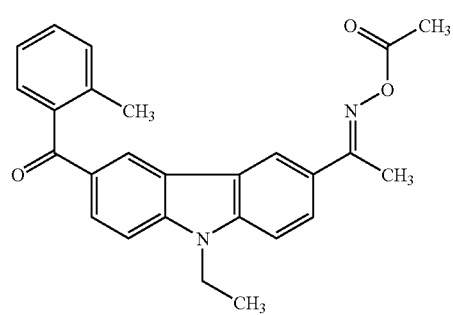

Example 2

A photosensitive resin composition for forming a light-shielding film was prepared in the same manner as in Example 1 except that photopolymerization initiator (K-2) was used instead of the oxime-based photopolymerization initiator (K-1).

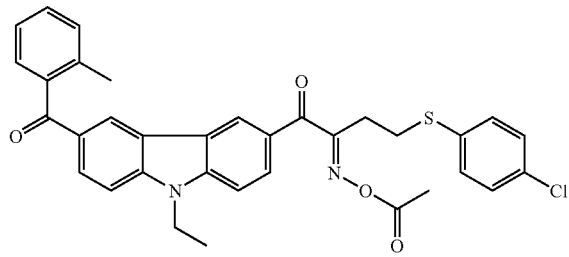

K-2

Example 3

A photosensitive resin composition for forming a light-shielding film was prepared in the same manner as in Example 1 except that photopolymerization initiator (K-3) was used instead of the oxime-based photopolymerization initiator (K-1).

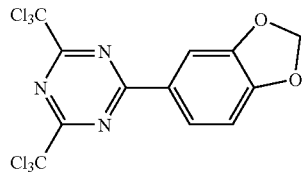

(K-3)

Example 4

A photosensitive resin composition for forming a light-shielding film was prepared in the same manner as in Example 1 except that (T-3) was used instead of (T-2).

Example 5

A photosensitive resin composition for forming a light-shielding film was prepared in the same manner as in Example 1 except that (T-4) was used instead of (T-2).

Example 6

A photosensitive resin composition for forming a light-shielding film was prepared in the same manner as in Example 1 except that 4.0 parts of (T-1) and 2.5 parts of (T-2) were used instead of 4.8 parts of (T-1) and 1.7 parts of (T-2).

Comparative Example 1

A photosensitive resin composition for a light-shielding film was prepared in the same manner as in Example 1 except that 6.5 parts of photopolymerizable compound (T-1) was used instead of 4.8 parts of photopolymerizable compound (T-1) and 1.7 parts of photopolymerizable compound (T-2).

Comparative Example 2

A photosensitive resin composition for a light-shielding film was prepared in the same manner as in Example 1 except that 6.5 parts of photopolymerizable compound (T-2) was used instead of 4.8 parts of photopolymerizable compound (T-1) and 1.7 parts of photopolymerizable compound (T-2).

(3) Preparation of Light-Shielding Film and Evaluation Thereof.

The photosensitive resin composition thus obtained was applied on an 8 inch silicon wafer by spin coating, and subsequently heated on a hot plate at 120° C. for 2 minutes.

Subsequently, exposure was carried out by an i ray stepper with a 3 mm square pattern from 100 mJ/cm$^2$ to 1,000 mJ/cm$^2$ in steps of 100 mJ/cm$^2$.

After irradiation, puddle development was carried out using a 0.3% aqueous solution of tetramethylammonium hydroxide (CD-2060, manufactured by FFEM) at 23° C. for 60 sec. Subsequently, rinsing with water was carried out by a spin shower.

The pattern thus obtained was examined by optical microscope and critical dimension SEM, and adhesion was evaluated.

Furthermore, other 8 inch silicon wafers were coated with each of the photosensitive resin compositions at 1,500 rpm (dry film thickness 2.0 µm), film thicknesses of a central portion and a portion near the edge were measured, and the difference therebetween was calculated and was used as an index for uniformity of coating thickness. The smaller the value, the better the coating uniformity.

TABLE 1

|  | Sensitivity at which good adhesion observed mJ/cm$^2$ | Coating thickness uniformity Δ µm |
| --- | --- | --- |
| Example 1 | 400 | 0.05 |
| Example 2 | 300 | 0.05 |
| Example 3 | 500 | 0.10 |
| Example 4 | 400 | 0.05 |
| Example 5 | 400 | 0.05 |
| Example 6 | 450 | 0.05 |
| Comparative Example 1 | 600 | 0.15 |
| Comparative Example 2 | 800 | 0.15 |

As shown in Table 1, when two or more types of polymerizable compounds were used in combination as the polymerizable compound, compared with a material obtained using one type of polymerizable compound on its own, better adhesion was obtained with a smaller amount of irradiation, and the coating thickness uniformity was better.

The invention claimed is:
1. A photosensitive resin composition comprising at least:
(A) titanium black;
(B) two or more types of polymerizable compounds;
(C) a resin;
(D) a photopolymerization initiator; and
(E) an organic solvent,
wherein the photopolymerization initiator (D) comprises an oxime-based initiator represented by Formula (2) below,

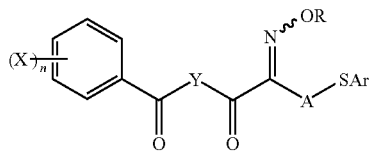

wherein, in Formula (2), R and X independently denote a monovalent substituent, A and Y independently denote a divalent organic group, Ar denotes an aryl group, and n is an integer of 0 to 5.

2. The photosensitive resin composition according to claim 1, wherein the two or more types of polymerizable compounds (B) comprise two or more types of polymerizable compounds having different numbers of ethylenically unsaturated groups per molecule.

3. The photosensitive resin composition according to claim 1, wherein the two or more types of polymerizable compounds (B) comprise full (meth)acrylic acid esters of two or more types of aliphatic polyols having different numbers of hydroxy groups.

4. The photosensitive resin composition according to claim 1, wherein the two or more types of polymerizable compounds (B) comprise (meth)acrylic acid esters of pentaerythritol and/or dipentaerythritol.

5. The photosensitive resin composition according to claim 1, wherein the oxime-based initiator is represented by Formula (3) below,

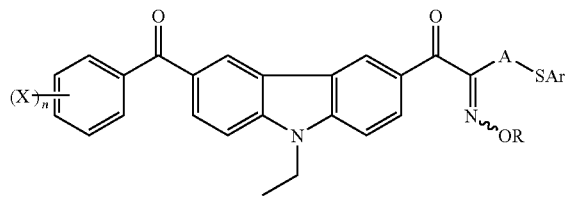

wherein, in Formula (3), R and X independently denote a monovalent substituent, A denotes a divalent organic group, Ar denotes an aryl group, and n is an integer of 0 to 5.

6. The photosensitive resin composition according to claim 1, wherein it is intended for use in an image sensor.

7. A light-shielding color filter comprising a pattern formed by using the photosensitive resin composition according to claim 1.

8. An image sensor comprising the light-shielding color filter according to claim 7.

9. A process for producing a light-shielding color filter, the process comprising:

a step of coating a substrate with the photosensitive resin composition according to claim 1;

a step of imagewise exposing; and a step of developing to form a pattern.

10. The photosensitive resin composition according to claim 1, wherein the resin (C) is an alkali-soluble resin having a double bond in a side chain.

11. The photosensitive resin composition according to claim 1, wherein the resin (C) has a polymerizable group-containing monomer unit and an acidic group-containing monomer unit.

12. The photosensitive resin composition according to claim 11, wherein the polymerizable group-containing monomer unit is a monomer unit having an acryloyloxy group or a methacryloyloxy group in a side chain.

* * * * *